(12) United States Patent
Kimura et al.

(10) Patent No.: US 8,383,862 B2
(45) Date of Patent: Feb. 26, 2013

(54) SALT COMPOUND, CATIONIC POLYMERIZATION INITIATOR AND CATIONICALLY POLYMERIZABLE COMPOSITION

(75) Inventors: Kentaro Kimura, Tokyo (JP); Shohei Fujita, Tokyo (JP); Tomoya Tamachi, Tokyo (JP)

(73) Assignee: Adeka Corporation, Tokyo (JP)

(*) Notice: Subject to any disclaimer, the term of this patent is extended or adjusted under 35 U.S.C. 154(b) by 254 days.

(21) Appl. No.: 12/740,984

(22) PCT Filed: Oct. 28, 2008

(86) PCT No.: PCT/JP2008/069562
§ 371 (c)(1),
(2), (4) Date: Apr. 30, 2010

(87) PCT Pub. No.: WO2009/057600
PCT Pub. Date: May 7, 2009

(65) Prior Publication Data
US 2010/0267857 A1    Oct. 21, 2010

(30) Foreign Application Priority Data

Nov. 1, 2007 (JP) ................................. 2007-285538
Jun. 5, 2008 (JP) ................................. 2008-147587

(51) Int. Cl.
| C07F 5/02 | (2006.01) |
| C08G 77/08 | (2006.01) |
| C08G 59/68 | (2006.01) |
| C08F 2/50 | (2006.01) |

(52) U.S. Cl. ............ 568/7; 568/1; 522/15; 522/25; 522/31; 522/66; 522/67; 528/13; 528/91; 528/138; 528/409; 528/408; 528/413

(58) Field of Classification Search .......... 522/15, 522/25, 31, 66, 67; 528/13, 91, 138, 409, 528/408, 413; 568/1, 7
See application file for complete search history.

(56) References Cited

U.S. PATENT DOCUMENTS

| 3,909,480 A | * | 9/1975 | Ogata et al. ................... 523/461 |
| 5,514,728 A | * | 5/1996 | Lamanna et al. .............. 522/31 |
| 5,541,000 A | * | 7/1996 | Hardy et al. .................. 428/413 |
| 5,744,511 A | * | 4/1998 | Kazama et al. ................ 522/25 |
| 5,932,393 A | * | 8/1999 | Cunningham et al. ..... 430/281.1 |
| 6,162,881 A | | 12/2000 | Schön et al. |
| 6,215,025 B1 | * | 4/2001 | Mitsui et al. .................. 568/6 |
| 6,785,854 B1 | | 8/2004 | Jaramillo et al. |
| 7,611,817 B2 | * | 11/2009 | Nakayashiki et al. ..... 430/270.1 |
| 2005/0009946 A1 | * | 1/2005 | Oguri et al. ................... 522/184 |
| 2005/0123778 A1 | | 6/2005 | Pehlert et al. |
| 2005/0261449 A1 | | 11/2005 | Voskoboynikov et al. |
| 2007/0128522 A1 | | 6/2007 | Gambut-Garel et al. |
| 2008/0241754 A1 | * | 10/2008 | Hayashi et al. ............. 430/287.1 |

FOREIGN PATENT DOCUMENTS

| EP | 0889361 A1 | 1/1999 |
| JP | 6-184170 A | 7/1994 |
| JP | 10-158314 A | 6/1998 |
| JP | 2000-186071 A | 7/2000 |
| JP | 2002-526391 A | 8/2002 |
| JP | 2004-501989 A | 1/2004 |
| JP | 2005-263796 A | 9/2005 |
| JP | 2006-522432 A | 9/2006 |
| JP | 2007-112854 A | 5/2007 |
| WO | WO 00/19967 | 4/2000 |
| WO | WO 02/00738 A1 | 1/2002 |
| WO | WO 2004/091033 A | 10/2004 |
| WO | WO 2007/020000 A2 | 2/2007 |

OTHER PUBLICATIONS

Extended European Search Report for Application No. 08844544.0 dated Apr. 24, 2012.

* cited by examiner

*Primary Examiner* — Sanza McClendon
(74) *Attorney, Agent, or Firm* — Birch, Stewart, Kolasch & Birch, LLP

(57) ABSTRACT

Provided are a salt compound, cationic polymerization initiator and cationically polymerizable composition, which have a superior acid-generating capacity and high sensitivity, and are free from coloration. The salt compound is represented by the following general Formula (1):

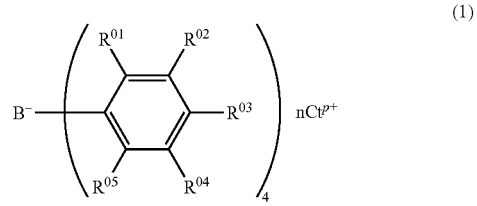

(wherein, $R^{01}$ to $R^{05}$ each independently represents a group selected from a hydrogen atom, a fluorine atom and —YR group, one of the $R^{01}$ to $R^{05}$ being a —YR group and at least two of the $R^{01}$ to $R^{05}$ being fluorine atoms; Y represents an oxygen atom or a sulfur atom; R represents a $C_1$-$C_4$ alkyl group; $Ct^{p+}$ represents a p-valent cation, the p being 1 or 2; and n represents a coefficient required for maintaining electrical neutrality).

10 Claims, No Drawings

SALT COMPOUND, CATIONIC POLYMERIZATION INITIATOR AND CATIONICALLY POLYMERIZABLE COMPOSITION

TECHNICAL FIELD

The present invention relates to a novel salt compound, a cationic polymerization initiator consisting of the salt compound, and a cationically polymerizable composition containing the cationic polymerization initiator.

BACKGROUND ART

A cationic polymerization initiator has a function to polymerize cationically polymerizable compounds, such as epoxy compounds, by generating an acid upon receiving energy, such as light or heat. A photo-acid generator has a function to change the solubility of a resist composition into a developer by generating an acid upon receiving light energy. Various onium salts have been used as a cationic polymerization initiator and photo-acid generator, and as the anion component of the onium salts, it has been known that antimony hexafluoride anion ($SbF_6^-$) has an excellent acid-generating function, exhibiting superior effects.

However, the toxicity of antimony hexafluoride has been regarded as a problem; therefore, alternatives have been studied. For instance, an onium salt compound prepared by using a fluorine-substituted tetraphenyl boric acid anion represented by $B(C_6F_5)_4^-$ is disclosed in Patent Document 1. Further, Patent Document 2 discloses $B(C_6F_5)_4^-$ and $B(C_6F_4OCF_3)_4^-$, which are fluorine-substituted tetraphenyl boric acid anions, as anions of an onium compound functioning as a photo-initiator, while Patent Document 3 discloses $B(C_6F_5)_4^-$ and $B(C_6F_4OCF_3)_4^-$, which are fluorine-substituted tetraphenyl boric acid anions, as anions of an onium compound functioning as a cationic initiator.

Furthermore, Patent Document 4 and Patent Document 5 disclose techniques in which an aromatic sulfonium salt and an aromatic sulfonium salt are used as a photo-polymerization initiator and photo-acid generator. Described therein as the anion of the aromatic sulfonium salt is tetraaryl borate.

Patent Document 1: Japanese Unexamined Patent Application Publication No. H 6-184170
Patent Document 2: Japanese Unexamined Patent Application Publication (Translation of PCT Application) No. 2002-526391
Patent Document 3: Japanese Unexamined Patent Application Publication (Translation of PCT Application) No. 2006-522432
Patent Document 4: Japanese Unexamined Patent Application Publication No. 2000-186071
Patent Document 5: Japanese Unexamined Patent Application Publication No. 2005-263796

DISCLOSURE OF THE INVENTION

Problems to be Solved by the Invention

As a cationic polymerization initiator or photo-acid generator, those that impart sufficient effects with an amount as small as possible with respect to the amount of cationically polymerizable composition or resist composition that contain them are desired. Therefore, those having a high decomposition rate in order for it to be decomposed by light or heat to generate an acid, as well as a superior acid-generating capacity, are suitable as a cationic polymerization initiator or photo-acid generator. Antimony hexafluoride anion is superior in this regard; however, there is a problem in its toxicity. Further, well-known fluorine-substituted tetraphenyl boric acid anions have a problem in that their photo-acid generating capacity is inferior to that of antimony hexafluoride anion. Furthermore, since there is a problem of coloring of resin compositions when antimony hexafluoride anion and well-known fluorine-substituted tetraphenyl boric acid anions are used, the application thereof is restricted in cases where these anions are used as a cationic polymerization initiator.

In view of the above, the object of the present invention is to provide a salt compound, cationic polymerization initiator and cationically polymerizable composition, which have a superior acid-generating capacity and high sensitivity, while being free from coloration.

Means for Solving the Problems

The present inventors intensively studied to solve the above-described problems and discovered that an anion compound having a specific structure solves the above-described problems, thereby completing the present invention.

That is, a salt compound according to the present invention is represented by the following general Formula (1):

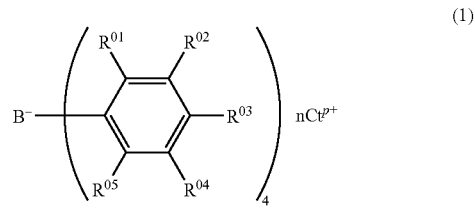

(wherein, $R^{01}$ to $R^{05}$ each independently represents a group selected from a hydrogen atom, a fluorine atom and —YR group, one of the $R^{01}$ to $R^{05}$ being a —YR group and at least two of the $R^{01}$ to $R^{05}$ being fluorine atoms;

Y represents an oxygen atom or a sulfur atom;

R represents a $C_1$-$C_4$ alkyl group;

$Ct^{p+}$ represents a p-valent cation, the p being 1 or 2; and n represents a coefficient required for maintaining electrical neutrality).

Further, it is preferred that $Ct^{p+}$ of the salt compound according to the present invention be an onium cation selected from a sulfonium cation, an iodonium cation, a diazonium cation, a phosphonium cation, an oxonium cation, a pyrilium cation and an ammonium cation.

Further, the cationic polymerization initiator according to the present invention consists of the above-described onium salt compound.

Still Further, the cationically polymerizable composition according to the present invention contains the above-described cationic polymerization initiator and a cationically polymerizable organic compound.

Effects of the Invention

By the present invention, a salt compound, cationic polymerization initiator and cationically polymerizable composition, which have a superior acid-generating capacity and high sensitivity, while being free from coloration, can be provided.

BEST MODE FOR CARRYING OUT THE INVENTION

The salt compound according to the present invention is a novel compound having an anion structure represented by the following general Formula (1):

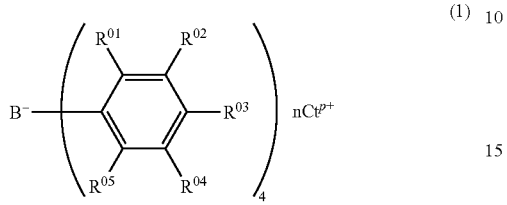

The salt compound constitutes a salt compound with a sulfonium cation, an iodonium cation and diazonium cation, and functions as a superior cationic polymerization initiator.

In the above general Formula (1), $R^{01}$ to $R^{05}$ each independently is a group selected from a hydrogen atom, a fluorine atom and —YR group, at least one of which is a —YR group and at least two of which are fluorine atoms. Examples of the $C_1$-$C_4$ alkyl group represented by R of the —YR group which may be $R^{01}$ to $R^{05}$ include methyl, ethyl, propyl, isopropyl, butyl, sec-butyl, isobutyl and tert-butyl.

Among the salt compounds represented by the general Formula (1), those compounds represented by the following general Formula (14), wherein $R^{03}$ at the p-position of the benzene ring to which a boron is bound is —YR group; and $R^{02}$ and $R^{04}$ at the m-positions are fluorine atoms, are preferred since the production cost is low and the effects of the present invention are prominent.

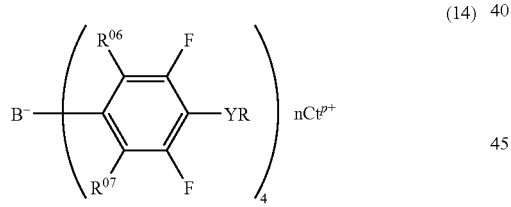

(wherein $R^{06}$ or $R^{07}$ represents a hydrogen atom or a fluorine atom; and —YR group and $Ct^{p+}$ are the same as in the above general Formula (1)).

Specific examples of the anion represented by the above general Formula (14) include the following anions No. 1 to No. 15.

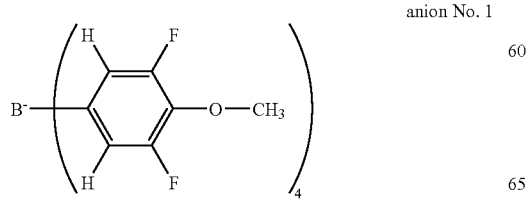

anion No. 1

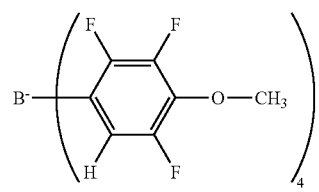

anion No. 2

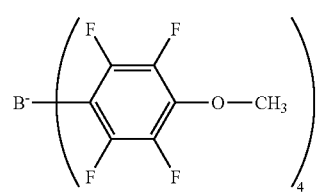

anion No. 3

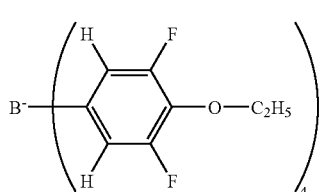

anion No. 4

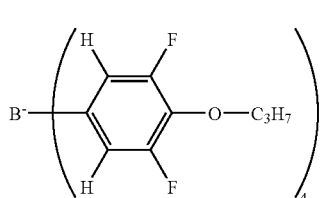

anion No. 5

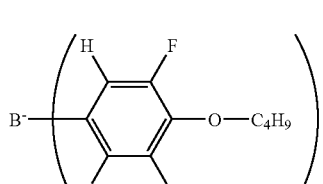

anion No. 6

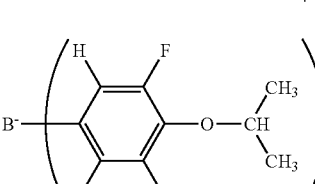

anion No. 7

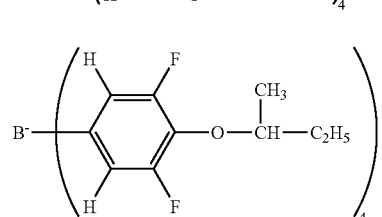

anion No. 8

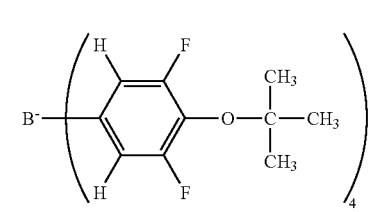

anion No. 9

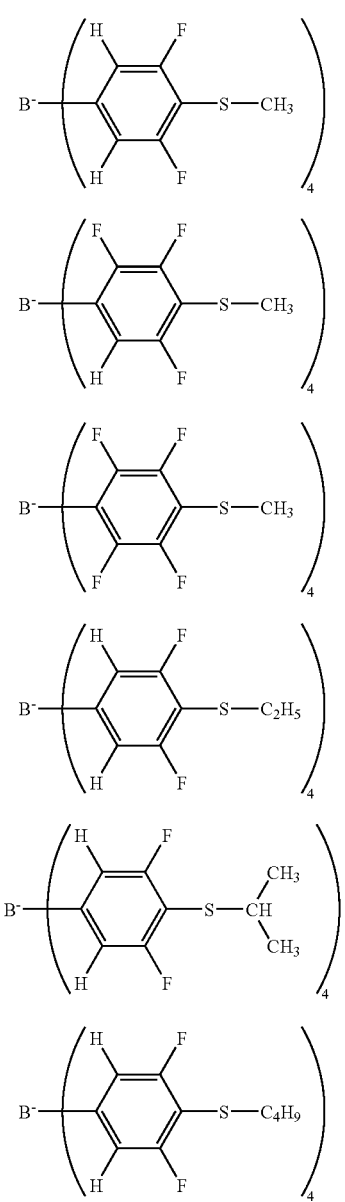

anion No. 10 anion No. 11 anion No. 12 anion No. 13 anion No. 14 anion No. 15

In the above general Formulae (1) and (14), $Ct^{p+}$ is a monovalent or divalent cation. The cation is not particularly restricted as long as it forms a salt with an anion according to the present invention. For example, the cation may be any of a metal cation, an onium cation and a metal chelate cation.

The salt compound according to the present invention can be obtained in a form in which, in the production process thereof, $Ct^{p+}$ is an alkali metal cation or alkaline earth metal cation. Examples of the alkali metal include lithium, sodium and potassium, and examples of the alkaline earth metal include beryllium, magnesium, calcium, strontium and barium.

The method of producing the salt compound according to the present invention is not particularly restricted and the salt compound according to the present invention can be produced using a well-known chemical reaction. For example, a salt compound in which $Ct^{p+}$ is an alkali metal can be synthesized by reacting a halide of a benzene ring having a structure corresponding to the general Formula (1) with a tri-halogenated boron under the presence of an alkylated alkali metal. Further, a salt compound in which $Ct^{p+}$ is an alkaline earth metal and one in which $Ct^{p+}$ is an onium cation can be synthesized by a salt exchange with a salt compound in which $Ct^{p+}$ is an alkali metal.

In the method of producing the salt compound according to the present invention, when a salt compound in which $Ct^{p+}$ is an alkali metal cation is produced, an attention should be paid in handling as the reactive intermediate between lithium alkyl and halogenated benzene decomposes explosively when the temperature rises to $-20°$ C. or higher. However, a temperature of not less than $-20°$ C. is required to effect a reaction with a tri-halogenated boron in order to produce a phenyl boric acid anion in which a fluorine is present at the position adjacent to a carbon atom bound to a boron (ortho position); therefore, there are problems in the yield and safety. The reaction between a phenyl boric acid anion whose ortho position is a hydrogen atom and tri-halogenated boron proceeds safely at a temperature not higher than $-20°$ C. From the standpoint of the cost and safety on the production, those salt compounds in which $R^{01}$ and $R^{05}$ of the general Formula (1) as well as $R^{06}$ and $R^{07}$ of the general Formula (14) are all hydrogen atoms, specifically anions No. 1, No. 4 to No. 10 and No. 13 to No. 15, are preferred.

Further, in the general Formulae (1) and (14), the salt compound according to the present invention whose Y is an oxygen atom is preferred when used as a cationic polymerization initiator, since it has a good sensitivity with little coloration.

Among the salt compounds according to the present invention, those functioning particularly effective as a cationic polymerization initiator are onium salt compounds in which $Ct^{p+}$ is selected from a sulfonium cation, an iodonium cation, a diazonium cation, a phosphonium cation, an oxonium cation, a pyrilium cation and an ammonium cation. These onium salt compounds are generally obtained by a cation exchange reaction from the alkali metal salt of the present invention.

In the salt compound according to the present invention, an onium cation having an aliphatic group which optionally has a substituent and/or an aromatic group which optionally has a substituent is used as a thermal cationic polymerization initiator. As a photo-cationic polymerization initiator, an onium cation having an aromatic group which optionally has a substituent is used. As the onium cation of the salt compound according to the present invention, a sulfonium cation represented by the general Formula (10) or (11) below having an aliphatic group and/or an aromatic group is particularly useful for a thermal cationic polymerization initiator, while an aromatic sulfonium cation represented by the general Formulae (2) to (5) below or an aromatic iodonium cation represented by the general Formula (13) below is particularly useful for a photo-cationic polymerization initiator, since these onium cations have a sufficient stability.

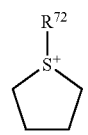

(10)

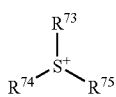

(wherein, R$^{72}$ represents a C$_1$-C$_{18}$ alkyl group which is optionally substituted by a hydroxyl group, a carboxyl group or a halogen atom, or a C$_1$-C$_{18}$ alkenyl group which is optionally substituted by a hydroxyl group, a carboxyl group or a halogen atom; and R$^{73}$ to R$^{75}$ represent a C$_1$-C$_{18}$ alkyl group which is optionally substituted by a hydroxyl group, a carboxyl group or a halogen atom; a C$_1$-C$_{18}$ alkenyl group which is optionally substituted by a hydroxyl group, a carboxyl group or a halogen atom; an aryl group represented by the following general Formulae (6) to (9):

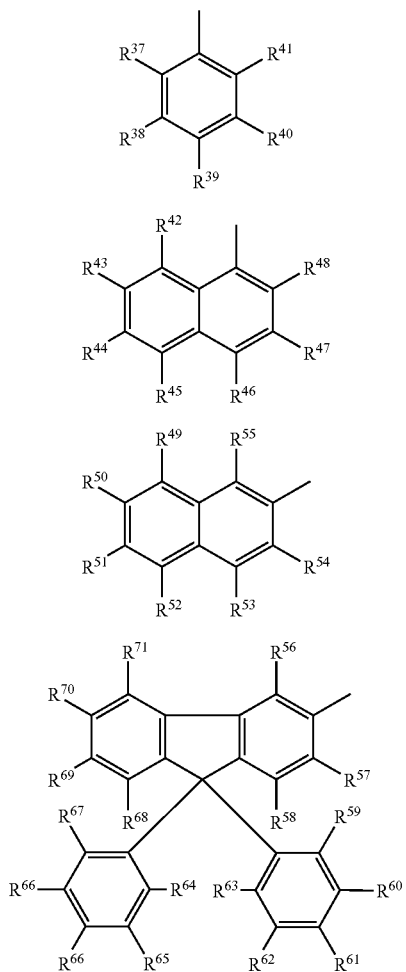

(wherein, R$^{37}$ to R$^{71}$ represent a hydrogen atom; a hydroxyl group; a halogen atom; a nitro group; a cyano group; a C$_1$-C$_{18}$ alkyl group which is optionally substituted by a hydroxyl group or a halogen atom; a C$_2$-C$_{18}$ acyl group which is optionally substituted by a hydroxyl group, a halogen atom or an ether group; a C$_1$-C$_{18}$ alkoxy group which is optionally substituted by a hydroxyl group, a halogen atom, an ether group or an ester group; a C$_2$-C$_{18}$ ether group which is optionally substituted by a hydroxyl group or a halogen; a C$_2$-C$_9$ organic carbonate ester group which is optionally substituted by a hydroxyl group or a halogen atom; a C$_2$-C$_8$ carbonyloxy group which is optionally substituted by a hydroxyl group or a halogen atom; a C$_1$-C$_8$ organic sulfonyloxy group which is optionally substituted by a hydroxyl group or a halogen atom; a C$_1$-C$_{18}$ alkylthio group which is optionally substituted by a hydroxyl group, a halogen atom or an ether group; a C$_6$-C$_{30}$ arylthio group which is optionally substituted by a halogen atom, a hydroxyl group or an aryl-carbonyl group; a C$_2$-C$_{18}$ sulfanyl group; a C$_1$-C$_{18}$ organic sulfinyl group; a C$_1$-C$_{18}$ organic sulfonyl group; or a C$_1$-C$_{18}$ organic sulfo group); or an aryl alkyl group represented by the following general Formula (12):

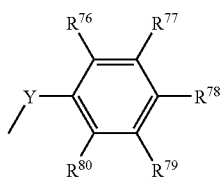

(wherein, Y represents a methylene chain which is optionally interrupted by —O—, —S— or —CO—; and R$^{76}$ to R$^{80}$ represent the same group (s) as the above-described R$^{37}$ to R$^{71}$), which methylene chain in the above-described C$_1$-C$_{18}$ alkyl group is optionally interrupted by —O—, —S— or —CO—).

In the above general Formulae (10) and (11), examples of the C$_1$-C$_{18}$ alkyl group represented by R$^{72}$ to R$^{75}$ include methyl, ethyl, propyl, isopropyl, butyl, sec-butyl, tert-butyl, isobutyl, amyl, isoamyl, tert-amyl, hexyl, 2-hexyl, 3-hexyl, cyclohexyl, 1-methyl cyclohexyl, heptyl, 2-heptyl, 3-heptyl, isoheptyl, tert-heptyl, n-octyl, isooctyl, tert-octyl, 2-ethyl-hexyl, nonyl, isononyl, decyl, dodecyl, tridecyl, tetradecyl, pentadecyl, hexadecyl, heptadecyl, octadecyl, cyclopentyl and cyclohexyl. The position(s) and the number of substitutions by a hydroxyl group, a carboxyl group and/or a halogen atom are arbitrary and the C$_1$-C$_{18}$ alkyl group optionally has any two of a hydroxyl group, a carboxyl group and a halogen atom as the substituents.

In the above general Formulae (10) and (11), examples of the C$_1$-C$_{18}$ alkenyl group represented by R$^{72}$ to R$^{75}$ include ethenyl, propenyl, isopropenyl and butenyl. The position(s) and the number of substitutions by a hydroxyl group, a carboxyl group or a halogen atom are arbitrary and the C$_1$-C$_{18}$ alkenyl group optionally has any two of a hydroxyl group, a carboxyl group and a halogen atom as the substituents.

In the above general Formula (12), examples of the methylene chain represented by Y which is optionally interrupted by —O—, —S— or —CO— include those shown in the following.

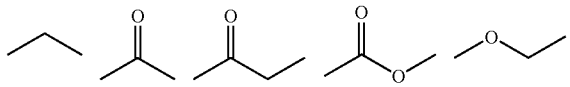

Specific examples of the sulfonium cation represented by the general Formula (10) include those shown in the following.

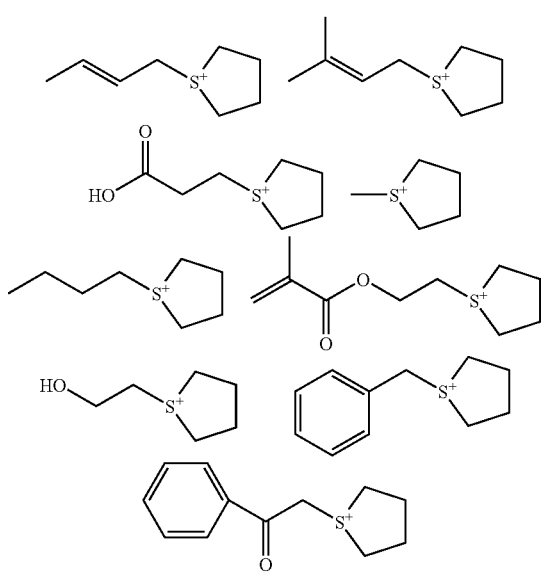

Specific examples of the sulfonium cation represented by the general Formula (11) include those shown in the following.

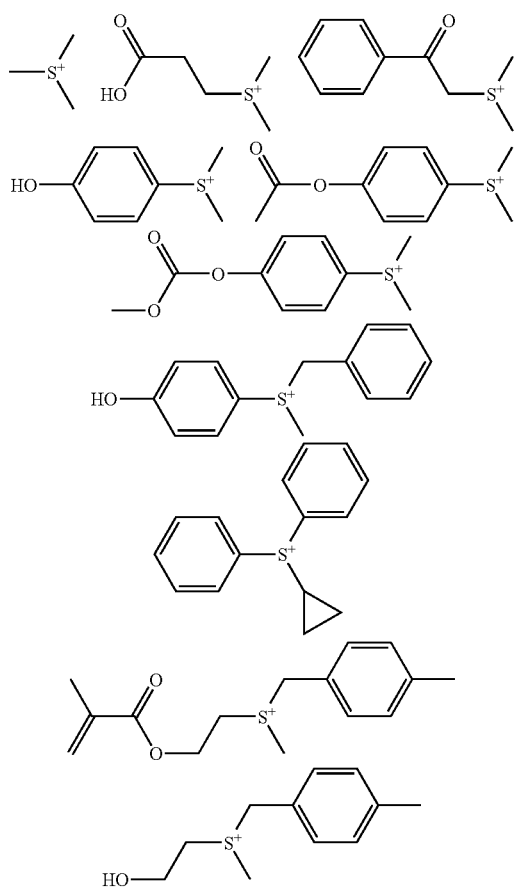

Further, as the onium cation of the salt compound according to the present invention, an aromatic sulfonium cation represented by the general Formulae (2) to (5) below or an aromatic iodonium cation represented by the general Formula (13) below is particularly useful for a photo-cationic polymerization initiator, since these onium cations have a sufficient stability.

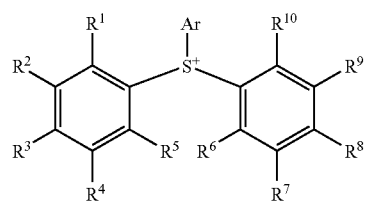
(2)

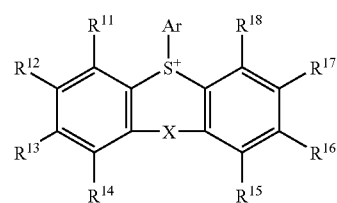
(3)

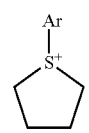
(4)

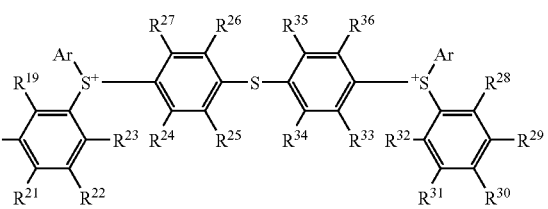
(5)

(wherein, $R^1$ to $R^{36}$ represent a hydrogen atom; a hydroxyl group; a halogen atom; a nitro group; a cyano group; a $C_1$-$C_{18}$ alkyl group which is optionally substituted by a hydroxyl group or a halogen atom; a $C_2$-$C_{18}$ acyl group which is optionally substituted by a hydroxyl group, a halogen atom or an ether group; a $C_1$-$C_{18}$ alkoxy group which is optionally substituted by a hydroxyl group, a halogen atom, an ether group or an ester group; a $C_2$-$C_{18}$ ether group which is optionally substituted by a hydroxyl group or a halogen atom; a $C_2$-$C_9$ organic carbonate ester group which is optionally substituted by a hydroxyl group or a halogen atom; a $C_2$-$C_8$ carbonyloxy group which is optionally substituted by a hydroxyl group or a halogen atom; a $C_1$-$C_8$ organic sulfonyloxy group which is optionally substituted by a hydroxyl group or a halogen atom; a $C_1$-$C_{18}$ alkylthio group which is optionally substituted by a hydroxyl group, a halogen atom or an ether group; a $C_6$-$C_{30}$ arylthio group which is optionally substituted by a halogen atom, a hydroxyl group or an aryl-carbonyl group; a $C_2$-$C_{18}$ sulfanyl group; a $C_1$-$C_{18}$ organic sulfinyl group; a $C_1$-$C_{18}$ organic sulfonyl group or a $C_1$-$C_{18}$ organic sulfo group;

X represents an oxygen atom, a sulfur atom, a carbonyl group or a direct bond; and Ar represents an aryl group represented by the following general Formulae (6) to (9))

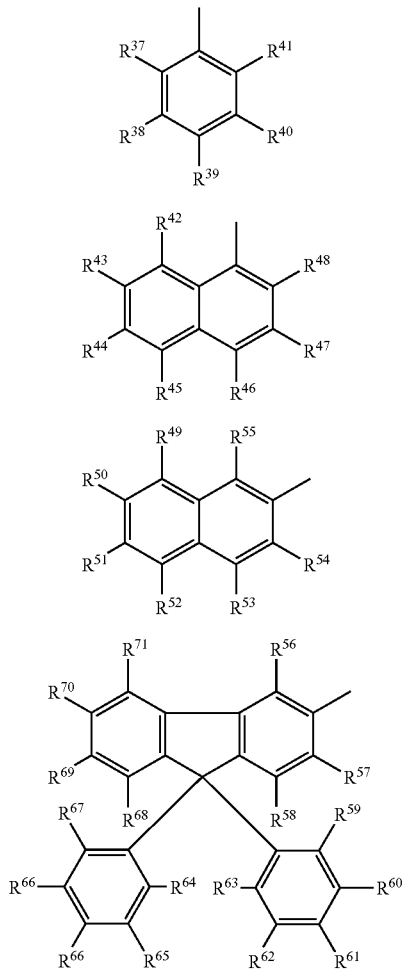

(wherein, $R^{37}$ to $R^{71}$ represent the same group(s) as said $R^1$ to $R^{36}$)

In the above general Formulae (2) to (5), examples of the $C_1$-$C_{18}$ alkyl group represented by $R^1$ to $R^{36}$ which is optionally substituted by a hydroxyl group or a halogen atom include methyl, ethyl, propyl, isopropyl, butyl, sec-butyl, tert-butyl, isobutyl, amyl, isoamyl, tert-amyl, hexyl, 2-hexyl, 3-hexyl, cyclohexyl, 1-methyl cyclohexyl, heptyl, 2-heptyl, 3-heptyl, isoheptyl, tert-heptyl, n-octyl, isooctyl, tert-octyl, 2-ethylhexyl, nonyl, isononyl, decyl, dodecyl, tridecyl, tetradecyl, pentadecyl, hexadecyl, heptadecyl, octadecyl. The position(s) and the number of substitutions by a hydroxyl group or a halogen atom are arbitrary and the $C_1$-$C_{18}$ alkyl group optionally has both of a hydroxyl group and a halogen atom as the substituents.

Further, the $C_2$-$C_{18}$ acyl group represented by $R^1$ to $R^{36}$ which is optionally substituted by a hydroxyl group, a halogen atom or an ether group may be any group represented by $R^{81}$—CO— ($R^{81}$ is a $C_1$-$C_{17}$ hydrocarbon radical which optionally has a hydroxyl group, a halogen atom or an ether group). Examples of $R^{81}$ include alkyl groups such as methyl, ethyl, propyl, isopropyl, butyl, sec-butyl, tert-butyl, isobutyl, amyl, isoamyl, tert-amyl, hexyl, 2-hexyl, 3-hexyl, cyclohexyl, 1-methyl cyclohexyl, heptyl, 2-heptyl, 3-heptyl, isoheptyl, tert-heptyl, n-octyl, isooctyl, tert-octyl, 2-ethylhexyl, nonyl, isononyl, decyl, dodecyl, tridecyl, tetradecyl, pentadecyl, hexadecyl and heptadecyl; alkenyl groups such as vinyl, 1-methylethenyl, 2-methylethenyl, propenyl, butenyl, isobutenyl, pentenyl, hexenyl, cyclohexenyl, heptenyl, octenyl, decenyl and pentadecenyl; alkynyl groups in which the double-bond portion between the carbon atoms of the above-described alkenyl groups is replaced by a triple-bond; aryl groups such as phenyl, naphthyl, 2-methylphenyl, 3-methylphenyl, 4-methylphenyl, 4-vinylphenyl, 3-isopropylphenyl, 4-isopropylphenyl, 4-butylphenyl, 4-isobutylphenyl, 4-tert-butylphenyl, 4-hexylphenyl, 4-cyclohexylphenyl, 4-octylphenyl, 4-(2-ethylhexyl)phenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di(tert-butyl)phenyl, 2,5-di(tert-butyl)phenyl, 2,6-di(tert-butyl)phenyl, 2,4-di(tert-pentyl)phenyl, 2,5-di(tert-amyl)phenyl, cyclohexylphenyl, biphenyl and 2,4,5-trimethylphenyl; and aryl-alkyl groups such as benzyl, phenetyl, 2-phenylpropane-2-yl, diphenylmethyl, triphenylmethyl, styryl and cinnamyl. The position(s) and the number of a hydroxyl group, a halogen atom or an ether group replaced in $R^{81}$ are arbitrary and $R^{81}$ optionally has both of a hydroxyl group and a halogen atom as the substituents.

Further, examples of the $C_1$-$C_{18}$ alkoxy group represented by $R^1$ to $R^{36}$ which is optionally substituted by a hydroxyl group, a halogen atom, an ether group or an ester group include methyloxy, ethyloxy, propyloxy, isopropyloxy, butyloxy, sec-butyloxy, tert-butyloxy, isobutyloxy, amyloxy, isoamyloxy, tert-amyloxy, hexyloxy, cyclohexyloxy, heptyloxy, isoheptyloxy, tert-heptyloxy, n-octyloxy, isooctyloxy, tert-octyloxy, 2-ethylhexyloxy, nonyloxy, isononyloxy, decyloxy, dodecyloxy, tridecyloxy, tetradecyloxy, pentadecyloxy, hexadecyloxy, heptadecyloxy, octadecyloxy and groups in which the above-mentioned groups are substituted by a hydroxyl group and/or a halogen atom and/or an ether group and/or an ester group at an arbitrary number and at an arbitrary position(s). In this case, the oxygen atom bound to the carbonyl group constituting the substituent ester group may be positioned either on the closer side or the far side to the skeleton to which $R^1$ to $R^{36}$ are bound (may be either —O—CO— or —CO—O—). Examples of the groups substituted by them include 2-hydroxyethyloxy, 2-methoxyethyloxy, 2-(2-hydroxyethoxy)ethyloxy, 2-(2-methoxyethoxy)ethyloxy, 2-[2-(2-hydroxyethoxy)ethoxy]ethyloxy, 2-[2-(2-methoxyethoxy)ethoxy]ethyloxy, 2-chloroethyloxy, 2-fluoroethyloxy, 2-(2-chloroethoxy)ethyloxy, 2-(2-fluoroethoxy)ethyloxy, 2-[2-(2-bromoethoxy)ethoxy]ethyloxy, 2-[2-(2-fluoroethoxy)ethoxy]ethyloxy, methyloxycarbonylmethyloxy, tert-butyloxycarbonylmethyloxy, 2-(methylcarbonyloxy)ethyloxy and 2-(tert-butylcarbonyloxy)ethyloxy.

Further, examples of the $C_2$-$C_{18}$ ether group represented by $R^1$ to $R^{36}$ which is optionally substituted by a hydroxyl group or a halogen atom include methoxymethyl, butoxymethyl, phenoxymethyl, 2-methoxyethyl, 2-butoxyethyl, 2-phenoxyethyl, 3-methoxypropyl, 3-butoxypropyl, 3-phenoxypropyl, 2-(2-methoxyethoxy)ethyl, 2-(2-butoxyethoxy)ethyl, 2-[2-(2-hydroxyethoxy)ethoxy]ethyl, 2-[2-(2-methoxyethoxy)ethoxy]ethyl and 2-(2-phenoxyethoxy)ethyl. The position(s) and the number of substitutions by a hydroxyl group or a halogen atom are arbitrary and the $C_2$-$C_{18}$ ether group optionally has both of a hydroxyl group and a halogen atom as the substituents.

Further, the $C_2$-$C_9$ organic carbonate ester group represented by $R^1$ to $R^{36}$ which is optionally substituted by a hydroxyl group or a halogen atom is a group represented by $R^{82}$—O—CO—O— ($R^{82}$ is a $C_1$-$C_8$ hydrocarbon radical which is optionally substituted by a hydroxyl group or a halogen atom). Examples of $R^{82}$ include methyl, ethyl, propyl, isopropyl, butyl, sec-butyl, tert-butyl, isobutyl, amyl, isoamyl, tert-amyl, hexyl, 2-hexyl, 3-hexyl, cyclohexyl, 1-methyl cyclohexyl, heptyl, 2-heptyl, 3-heptyl, isoheptyl, tert-heptyl, n-octyl, isooctyl and tert-octyl. The position(s) and the number of substitutions by a hydroxyl group or a halogen atom in $R^{82}$ are arbitrary and $R^{82}$ optionally has both of a hydroxyl group and a halogen atom as the substituents.

Further, the $C_2$-$C_8$ carbonyloxy group represented by $R^1$ to $R^{36}$ which is optionally substituted by a hydroxyl group or a halogen atom is a group represented by $R^{83}$—CO—O— ($R^{83}$ is a $C_1$-$C_7$ hydrocarbon radical which is optionally substituted by a hydroxyl group or a halogen atom), which is a group derived from a $C_1$-$C_8$ organic acid. Examples of the carboxylic acid from which the group is derived include acetic acid, chloroacetic acid, dichloroacetic acid, trichloroacetic acid, fluoroacetic acid, propionic acid, acrylic acid, methacrylic acid, butyric acid, isobutyric acid, lactic acid, valeric acid, caproic acid, caprylic acid, 2-ethylhexanoic acid, benzoic acid and salicylic acid.

Further, the $C_1$-$C_8$ organic sulfonyloxy group which is optionally substituted by a hydroxyl group or a halogen atom is a group represented by $R^{84}$—$SO_2$—O— ($R^{84}$ is a $C_1$-$C_8$ hydrocarbon radical which is optionally substituted by a hydroxyl group or a halogen atom), which is a group derived from a $C_1$-$C_8$ organic sulfonic acid. Examples of the organic sulfonic acid from which the group is derived include methanesulfonic acid, trifluoromethanesulfonic acid, ethanesulfonic acid, pentafluorobutane sulfonic acid, butane sulfonic acid, nonafluorobutane sulfonic acid, benzenesulfonic acid, toluenesulfonic acid and 2-hydroxyethane sulfonic acid.

Further, examples of the $C_1$-$C_{18}$ alkylthio group represented by $R^1$ to $R^{36}$ include a group in which the oxygen atom directly bound to the alkyl group of the above alkoxy group is substituted by a sulfur atom.

Further, the $C_6$-$C_{30}$ arylthio group which is optionally substituted by a halogen atom, a hydroxyl group or an arylcarbonyl group is a group represented by —S—$Ar^1$ ($Ar^1$ is a $C_6$-$C_{30}$ aryl group which is optionally substituted by a hydroxyl group, a halogen atom or a carbonyl-aryl group). Examples of $Ar^1$ include phenyl, naphthyl, 2-methylphenyl, 3-methylphenyl, 4-methylphenyl, 4-vinylphenyl, 3-isopropylphenyl, 4-isopropylphenyl, 4-butylphenyl, 4-isobutylphenyl, 4-tert-butylphenyl, 4-hexylphenyl, 4-cyclohexylphenyl, 4-octylphenyl, 4-(2-ethylhexyl)phenyl, 4-stearylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di(tert-butyl)phenyl, 2,5-di(tert-butyl)phenyl, 2,6-di(tert-butyl)phenyl, 2,4-di(tert-pentyl)phenyl, 2,5-di(tert-amyl)phenyl, 2,5-di(tert-octyl)phenyl, 2,4-dicumylphenyl, cyclohexylphenyl, biphenyl, 2,4,5-trimethylphenyl, 2-hydroxyphenyl, 3-hydroxyphenyl, 4-hydroxyphenyl, 2-chlorophenyl, 3-chlorophenyl, 4-chlorophenyl, 4-fluorophenyl, 2-chloro-4-(phenylcarbonyl)phenyl and 2-fluoro-4-(phenylcarbonyl)phenyl.

Further, examples of the $C_2$-$C_{18}$ sulfanyl group represented by $R^1$ to $R^{36}$ which is optionally substituted by a hydroxyl group, a halogen atom or an ether group include groups in which at least one of the oxygen atoms of the above ether group is replaced by a sulfur atom. The position(s) and the number of substitutions by a hydroxyl group, a halogen atom or an ether group are arbitrary.

Further, the $C_1$-$C_{18}$ organic sulfinyl group represented by $R^1$ to $R^{36}$ may be any group represented by $R^{85}$—SO— ($R^{85}$ is a $C_1$-$C_{18}$ hydrocarbon radical which optionally has a substituent). Examples of $R^{85}$ include alkyl groups such as methyl, ethyl, propyl, isopropyl, butyl, sec-butyl, tert-butyl, isobutyl, amyl, isoamyl, tert-amyl, hexyl, 2-hexyl, 3-hexyl, cyclohexyl, 1-methylcyclohexyl, heptyl, 2-heptyl, 3-heptyl, isoheptyl, tert-heptyl, n-octyl, isooctyl, tert-octyl, 2-ethylhexyl, nonyl, isononyl, decyl, dodecyl, tridecyl, tetradecyl, pentadecyl, hexadecyl, heptadecyl, octadecyl and 2-[bicyclo [2.2.1]-heptane-2-yl]ethyl; alkenyl groups such as vinyl, 1-methylethenyl, 2-methylethenyl, propenyl, butenyl, isobutenyl, pentenyl, hexenyl, cyclohexenyl, heptenyl, octenyl, decenyl, pentadecenyl and octadecenyl; alkynyl groups in which the double-bond portion between the carbon atoms of the above-described alkenyl groups is replaced by a triple-bond; aryl groups such as phenyl, naphthyl, 2-methylphenyl, 3-methylphenyl, 4-methylphenyl, 4-vinylphenyl, 3-isopropylphenyl, 4-isopropylphenyl, 4-butylphenyl, 4-isobutylphenyl, 4-tert-butylphenyl, 4-hexylphenyl, 4-cyclohexylphenyl, 4-octylphenyl, 4-(2-ethylhexyl)phenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,4-di(tert-butyl)phenyl, 2,5-di(tert-butyl)phenyl, 2,6-di(tert-butyl)phenyl, 2,4-di(tert-pentyl)phenyl, 2,5-di(tert-amyl)phenyl, cyclohexylphenyl, biphenyl and 2,4,5-trimethylphenyl; and aryl-alkyl groups such as benzyl, phenetyl, 2-phenylpropane-2-yl, diphenylmethyl, triphenylmethyl, styryl and cinnamyl. Examples of the substituents of $R^{85}$ include a hydroxyl group, a halogen atom, a nitro group, a cyano group and an ether group, and the position (s) and the number of substitutions are arbitrary.

Further, the $C_1$-$C_{18}$ organic sulfonyl group represented by $R^1$ to $R^{36}$ may be any group represented by $R^{86}$—$SO_2$— ($R^{86}$ is a $C_1$-$C_{18}$ hydrocarbon radical which optionally has a substituent). Examples of $R^{86}$ include the groups exemplified for $R^{85}$ in the above.

Further, the $C_1$-$C_{18}$ organic sulfo group represented by $R^1$ to $R^{36}$ may be any group represented by $R^{87}$—O—$SO_2$— ($R^{87}$ is a $C_1$-$C_{18}$ hydrocarbon radical which optionally has a substituent). Examples of $R^{87}$ include the groups exemplified for $R^{85}$ in the above.

In the above general Formulae (2) to (5) according to the present invention, the aryl group represented by Ar is a group selected from the above general Formulae (6) to (9), wherein $R^{37}$ to $R^{71}$ are the same group (s) as the above-described $R^1$ to $R^{36}$. Specific examples thereof include those groups exemplified for $R^1$ to $R^{36}$ in the above.

Specific examples of the sulfonium cation represented by the general Formula (2) include the followings.

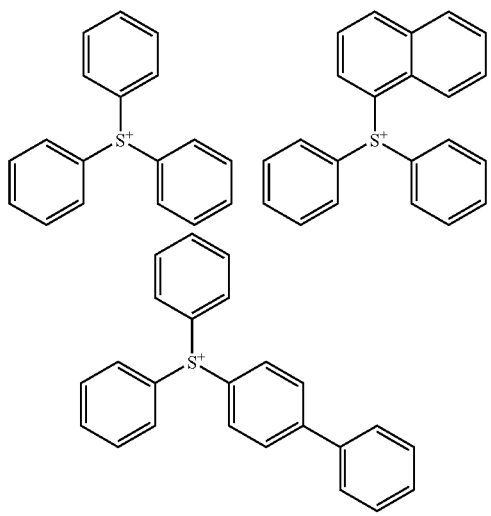

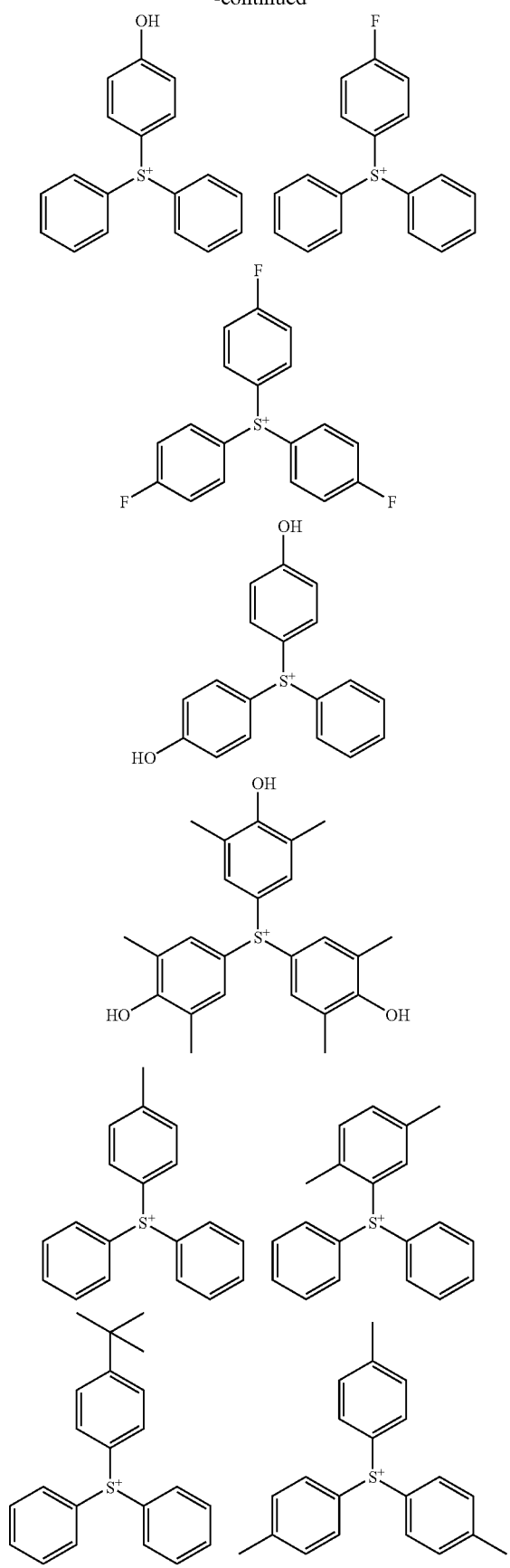
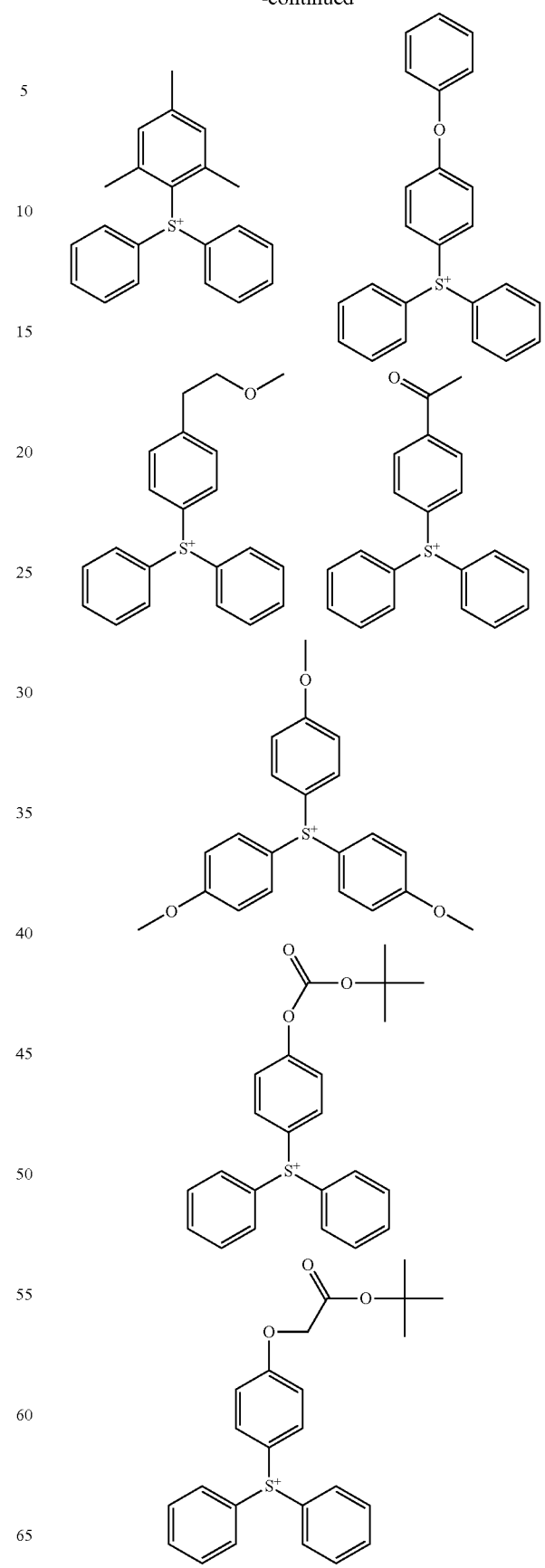

-continued
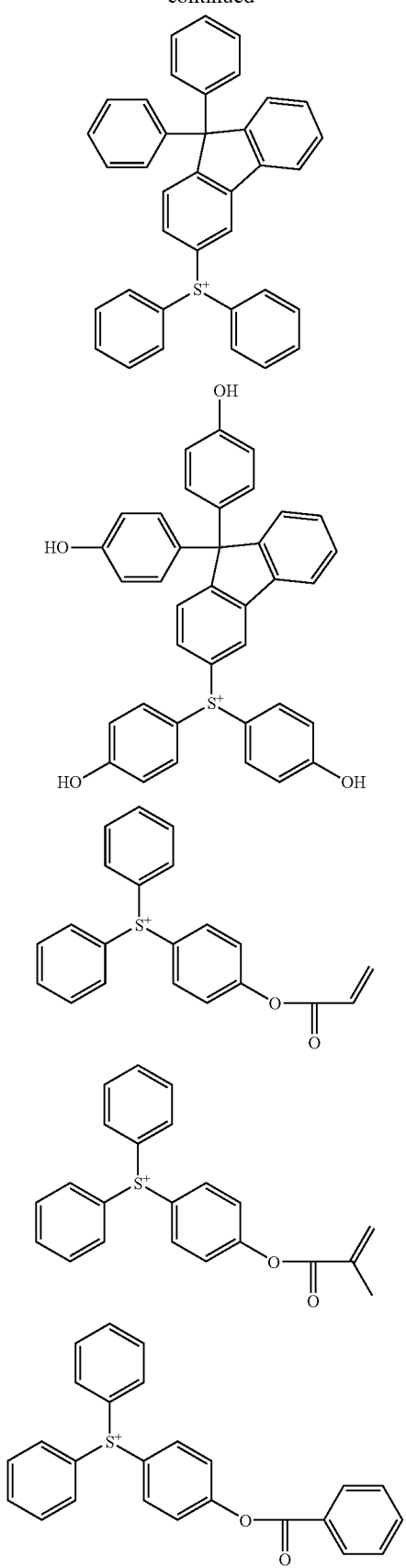
-continued
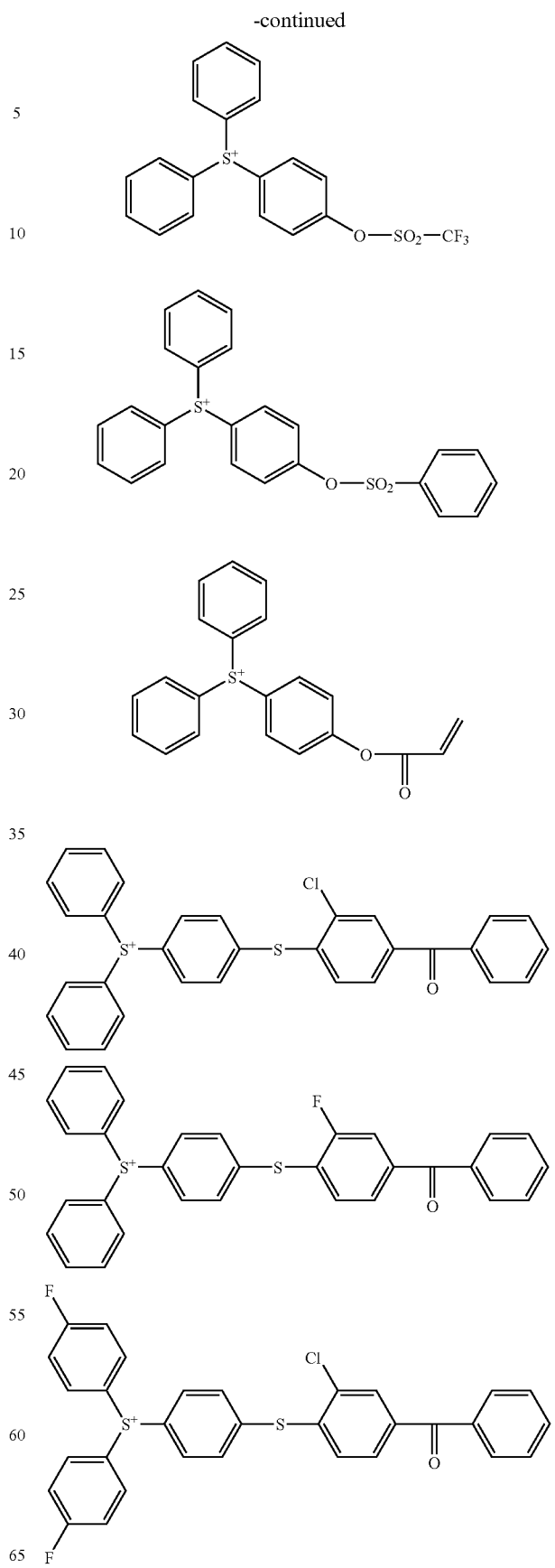

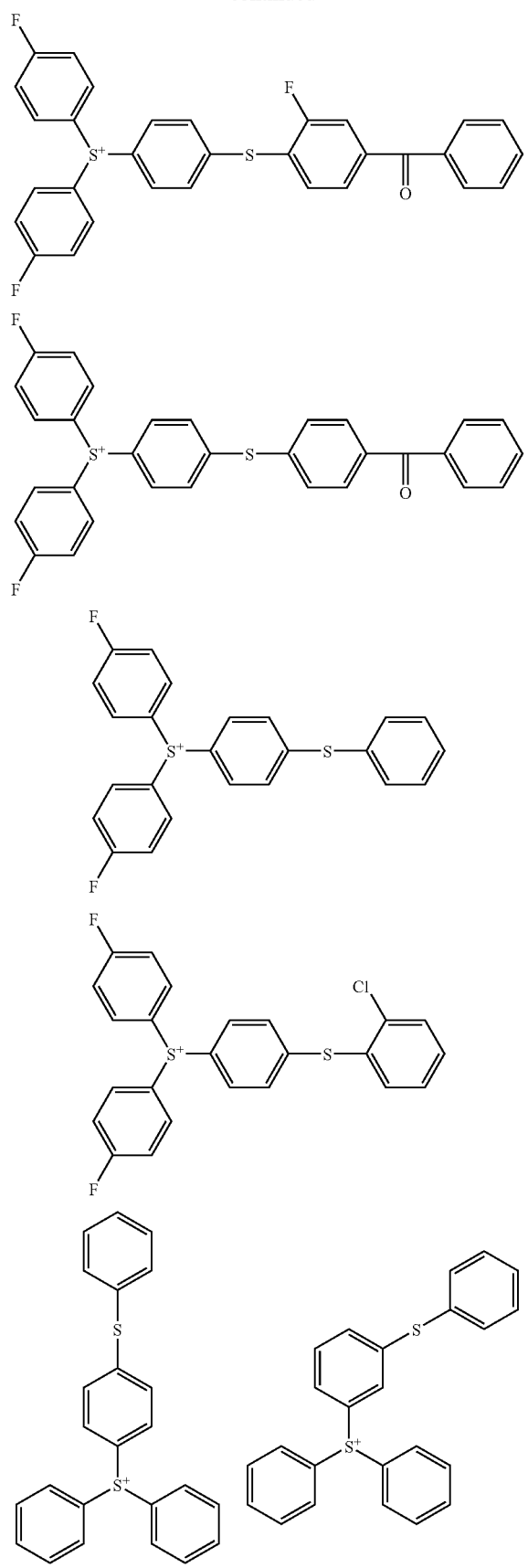
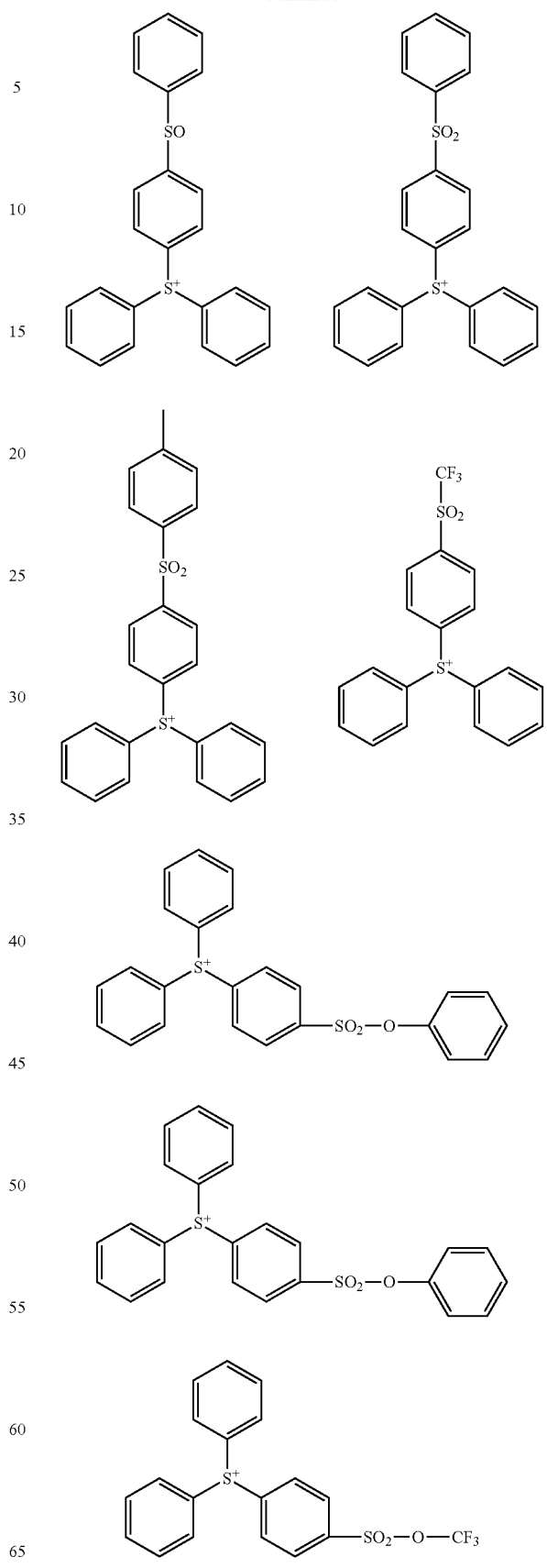

-continued
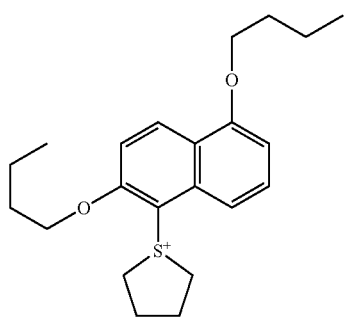 [SMILES: CCCCOc1ccc2c(OCCCC)cccc2c1[S+]1CCCC1]
Specific examples of the sulfonium cation represented by the general Formula (3) include the followings.
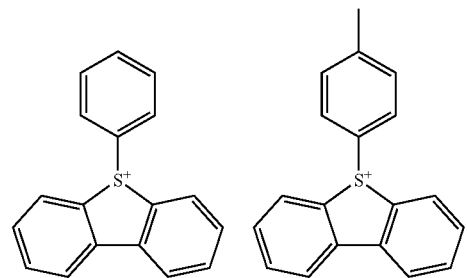
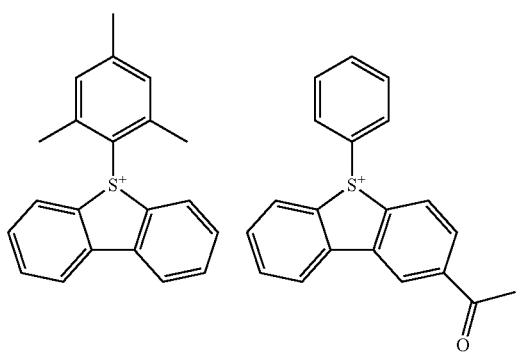
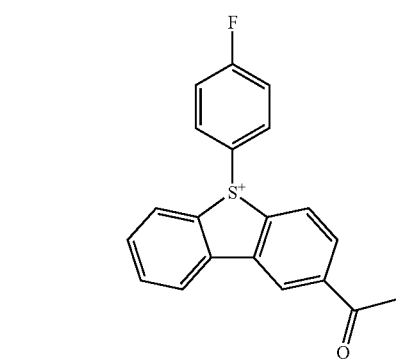
-continued
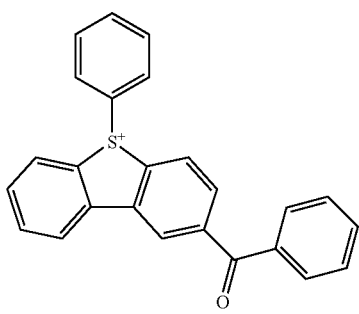
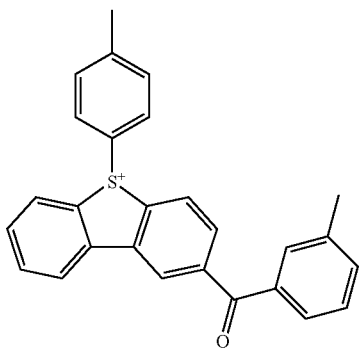
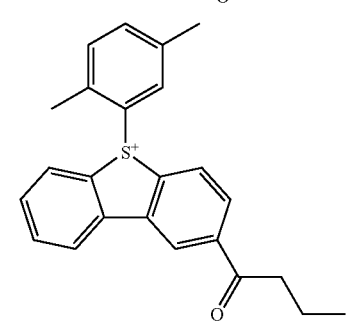
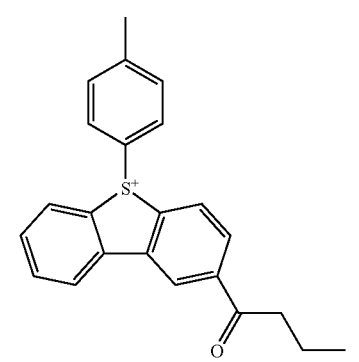
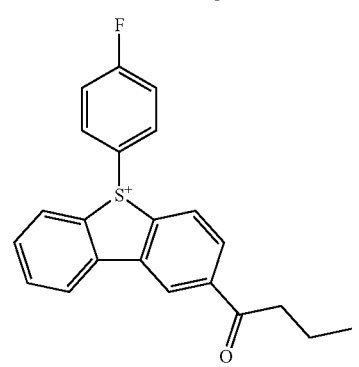

-continued
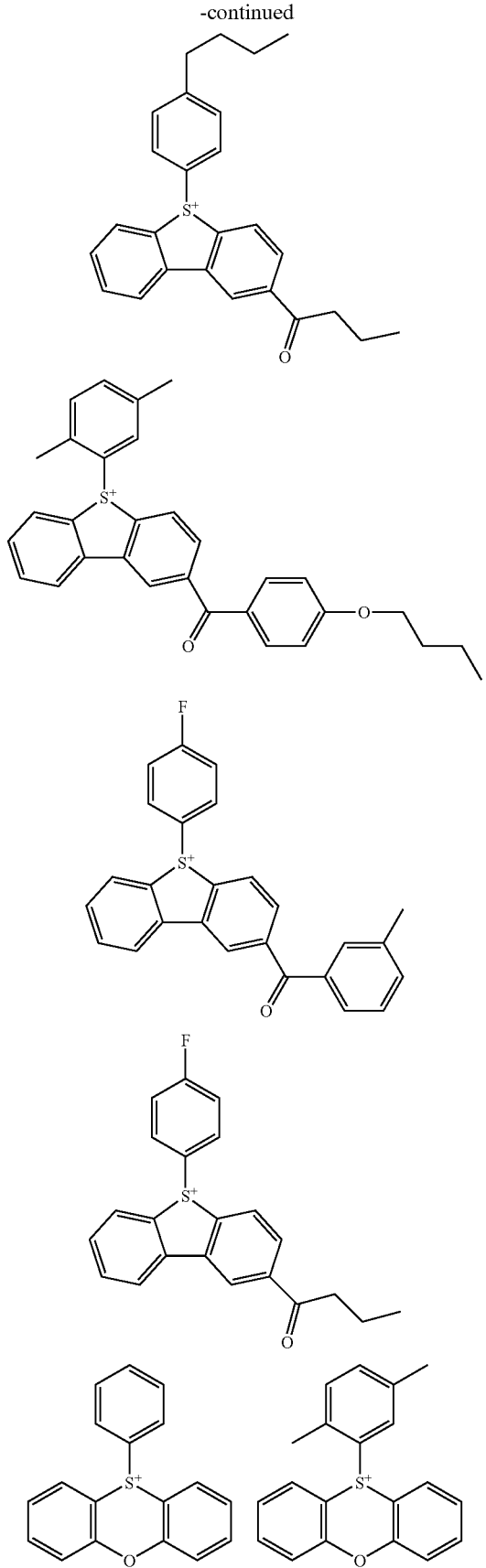
-continued
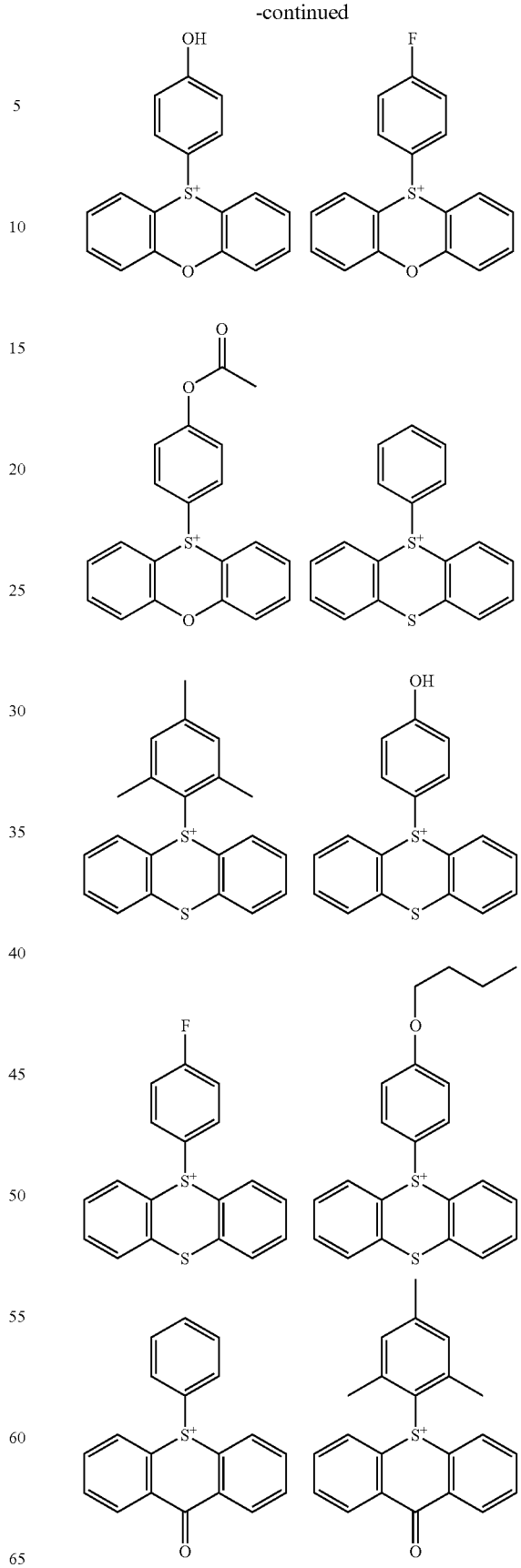

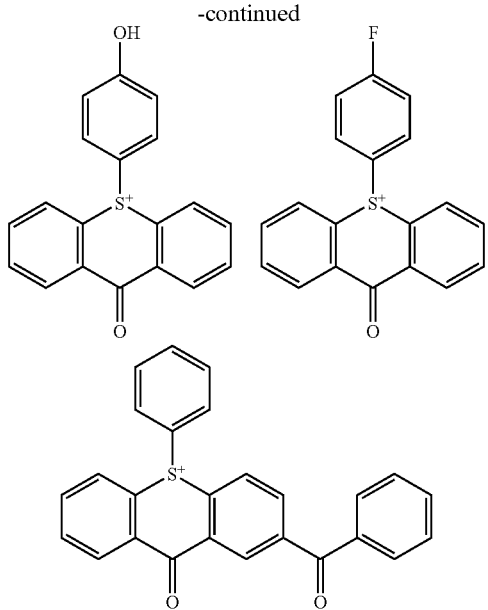
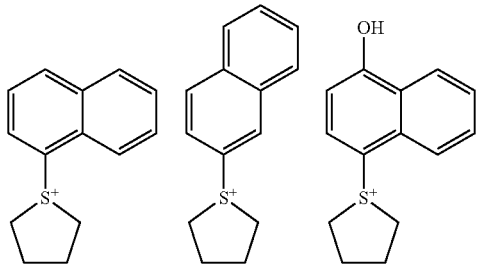
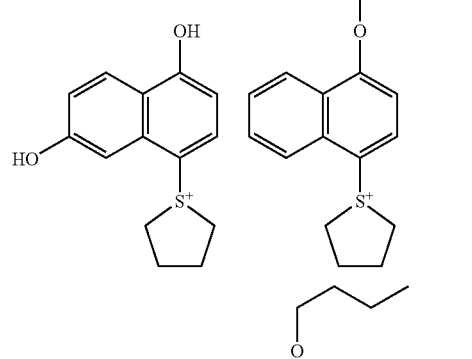
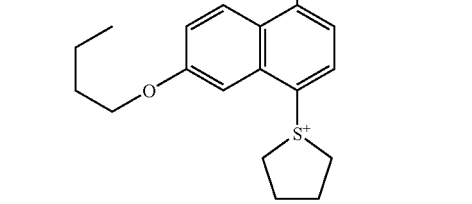
Specific examples of the sulfonium cation represented by the general Formula (4) include the followings.
Specific examples of the sulfonium cation represented by the general Formula (5) include the followings.
(13)
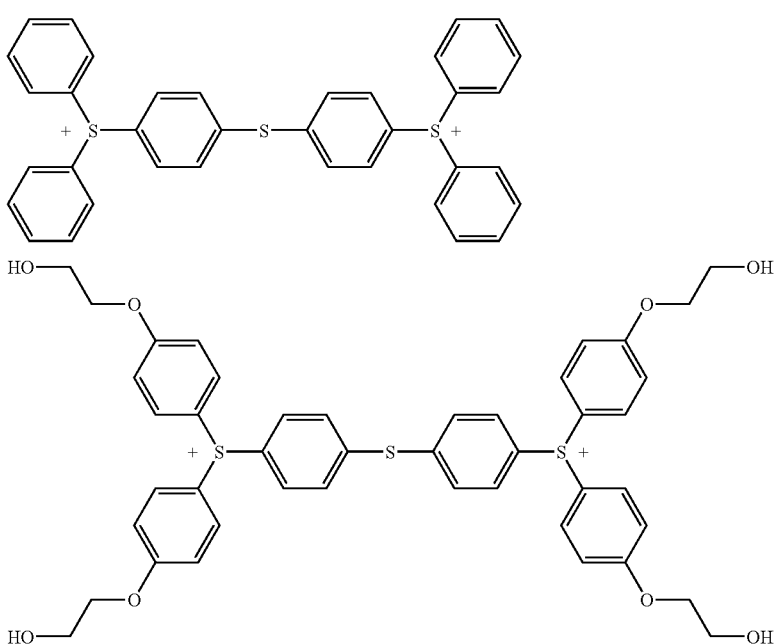

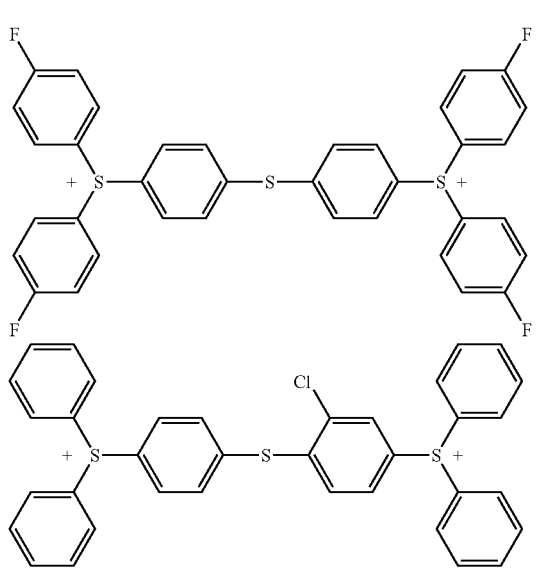
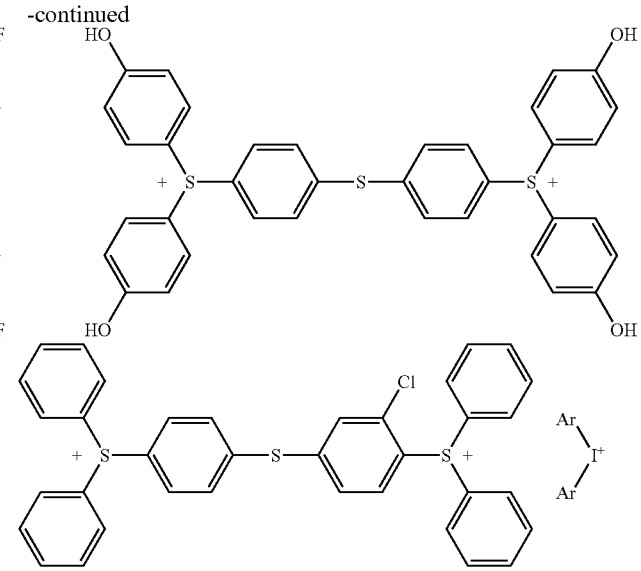

(wherein, Ar represents an aryl group represented by the above general Formulae (6) to (9))

Specific examples of the iodonium cation represented by the general Formula (13) include the followings.

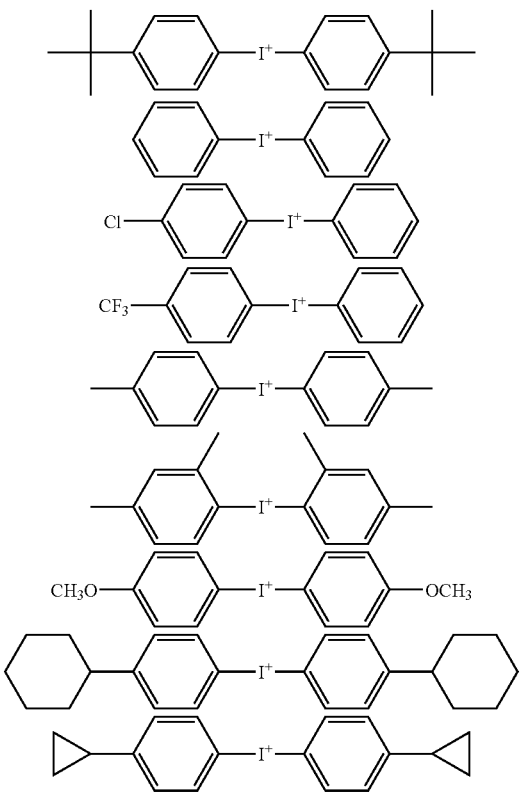

The cationically polymerizable composition according to the present invention contains a cationic polymerization initiator consisting of an onium salt compound in which $Ct^{p+}$ of the above-described salt compound according to the present invention is selected from the group consisting of a sulfonium cation, an iodonium cation, a diazonium cation, a phosphonium cation, an oxonium cation, a pyrilium cation and an ammonium cation, as well as a cationicallypolymerizable organic compound. In the present invention, the cationically polymerizable organic compound is used solely or two or more cationically polymerizable organic compounds are used in combination.

Typical compounds of such cationically polymerizable organic compound include epoxy compounds and oxetane compounds. These are preferred compounds as they are readily available and convenient in handling.

As such epoxy compound, alicyclic epoxy resin, aromatic epoxy resin, aliphatic epoxy resin and the like are suitable.

Specific examples of the alicyclic epoxy resin include cyclohexene oxides which can be obtained by, using an oxidizing agent, epoxidizing polyglycidyl ether or cyclohexene of polyhydric alcohol having at least one alicyclic ring or a cyclopentene ring-containing compound; and cyclopentene oxide-containing compounds. Examples thereof include hydrogenated bisphenol A diglycidyl ether, 3,4-epoxy cyclohexylmethyl-3,4-epoxy cyclohexane carboxylate, 3,4-epoxy-1-methyl cyclohexyl-3,4-epoxy-1-methyl cyclohexane carboxylate, 6-methyl-3,4-epoxy cyclohexylmethyl-6-methyl-3,4-epoxy cyclohexane carboxylate, 3,4-epoxy-3-methyl cyclohexylmethyl-3,4-epoxy-3-methyl cyclohexane carboxylate, 3,4-epoxy-5-methyl cyclohexylmethyl-3,4-epoxy-5-methyl cyclohexane carboxylate, 2-(3,4-epoxy cyclohexyl-5,5-spiro-3,4-epoxy)cyclohexane-methadioxane, bis(3,4-epoxy cyclohexylmethyl)adipate, 3,4-epoxy-6-methyl cyclohexyl carboxylate, methylene bis(3,4-epoxy cyclohexane), dicyclopentadiene diepoxide, ethylene bis(3,4-epoxy cyclohexane carboxylate), epoxy hexahydrophthalic acid dioctyl and epoxy hexahydrophthalic acid di-2-ethylhexyl.

Further, examples of the commercially available products suitably used as the alicyclic epoxy resin include: UVR-6100, UVR-6105, UVR-6110, UVR-6128 and UVR-6200 (the above are manufactured by Union Carbide Corporation); Celloxide 2021, Celloxide 2021P, Celloxide 2081, Celloxide 2083, Celloxide 2085, Celloxide 2000, Celloxide 3000, Cyclomer A200, Cyclomer M100, Cyclomer M101, Epolead GT-301, Epolead GT-302, Epolead 401, Epolead 403, ETHB and Epolead HD300 (the above are manufactured by DAICEL CHEMICAL INDUSTRIES, LTD.); and KRM-2110 and KRM-2199 (the above are manufactured by ADEKA CORPORATION).

Further, among alicyclic epoxy resins, epoxy resins having a cyclohexene oxide structure are preferred for their curability (curing rate).

Specific examples of the aromatic epoxy resin include polyhydric phenol having at least one aromatic ring or polyglycidyl ether of alkylene oxide adduct thereof, for example, bisphenol A, bisphenol F or glycidyl ether and epoxy novolak resin that are compounds prepared by further adding alkylene oxide to these bisphenol A and bisphenol F.

Further, specific examples of the aliphatic epoxy resion include an aliphatic polyhydric alcohol or polyglycidyl ether of alkylene oxide adduct thereof; a polyglycidyl ester of long-chain aliphatic polybasic acid; homopolymers synthesized by vinyl polymerization of glycidyl acrylate or glycidyl methacrylate; and copolymers synthesized by vinyl polymerization of glycidyl acrylate or glycidyl methacrylate and other vinyl monomers. Examples of typical compound include glycidyl ether of polyhydric alcohol, such as 1,4-butanediol diglycidyl ether, 1,6-hexanediol diglycidyl ether, triglycidyl ether of glycerine, triglycidyl ether of trimethylolpropane, tetraglycidyl ether of sorbitol, hexaglycidyl ether of dipentaerythritol, diglycidyl ether of polyethylene glycol, diglycidyl ether of polypropylene glycol; polyglycidyl ether of polyether polyol which can be obtained by adding one or more alkylene oxides to aliphatic polyhydric alcohol, such as propylene glycol, trimethylolpropane and glycerine; and diglycidyl ester of long-chain aliphatic dibasic acid. Further, monoglycidyl ether of aliphatic higher alcohol; phenol; cresol; butylphenol or monoglycidyl ether of polyether alcohol which can be obtained by adding alkylene oxide(s) thereto; glycidyl ester of higher fatty acid; epoxidized soybean oil; epoxy octyl stearate; epoxy butyl stearate; epoxidized polybutadiene and the like are also exemplified.

Examples of the commercially available products suitably used as the aromatic epoxy resin and aliphatic epoxy resin include: EPIKOTE 801 and EPIKOTE 828 (the above are manufactured by Japan Epoxy Resins Co., Ltd.); PY-306, 0163 and DY-022 (the above are manufactured by Nihon Ciba-Geigy K.K.); KRM-2720, EP-4100, EP-4000, EP-4080, EP-4900, ED-505 and ED-506 (the above are manufactured by ADEKA CORPORATION); EPOLIGHT M-1230, EPOLIGHT EHDG-L, EPOLIGHT 40E, EPOLIGHT 100E, EPOLIGHT 200E, EPOLIGHT 400E, EPOLIGHT 70P, EPOLIGHT 200P, EPOLIGHT 400P, EPOLIGHT 1500NP, EPOLIGHT 1600, EPOLIGHT 80MF, EPOLIGHT 100MF, EPOLIGHT 4000, EPOLIGHT 3002 and EPOLIGHT FR-1500 (the above are manufactured by KYOEISHA CHEMICAL Co., LTD.); and Santoto ST0000, YD-716, YH-300, PG-202, PG-207, YD-172 and YDPN 638 (the above are manufactured by Tohto Kasei Co., Ltd.).

Further, specific examples of the oxetane compound include, for example, the followings: 3-ethyl-3-hydroxymethyloxetane, 3-(meta)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenylether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl)ether, 2-ethylhexyl(3-ethyl-3-oxetanylmethyl)ether, ethyl diethylene glycol(3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl (3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl) ether, 3,7-bis(3-oxetanyl)-5-oxa-nonane, 3,3'-(1,3-(2-methylenyl)propane diylbis(oxymethylene))bis-(3-ethyloxetane), 1,4-bis[(3-ethyl-3-oxetanylmethoxy)methyl] benzene, 1,2-bis[(3-ethyl-3-oxetanylmethoxy)methyl] ethane, 1,3-bis[(3-ethyl-3-oxetanylmethoxy)methyl] propane, ethylene glycol bis(3-ethyl-3-oxetanylmethyl) ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecane diyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritoltetrakis(3-ethyl-3-oxetanylmethyl)ether, caprolactone modified dipentaerythritol hexakis(3-ethyl-3-oxetanylmethyl)ether, caprolactone modified dipentaerythritol pentakis(3-ethyl-3-oxetanylmethyl)ether, ditrimethylolpropane tetrakis(3-ethyl-3-oxetanylmethyl)ether, EO modified bisphenol A bis(3-ethyl-3-oxetanylmethyl)ether, PO modified bisphenol A bis (3-ethyl-3-oxetanylmethyl)ether, EO modified hydrogenated bisphenol A bis(3-ethyl-3-oxetanylmethyl)ether, PO modified hydrogenated bisphenol A bis(3-ethyl-3-oxetanylmethyl)ether and EO modified bisphenol F (3-ethyl-3-oxetanylmethyl)ether.

These oxetane compounds are effectively used and preferred especially when flexibility is required.

Other specific examples of the cationically polymerizable organic compound include well-known compounds, for example, oxolane compounds such as tetrahydrofuran and 2,3-dimethyltetrahydrofuran; cyclic acetal compounds such as trioxane, 1,3-dioxolane and 1,3,6-trioxane cyclooctane; cyclic lactone compounds such as β-propiolactone and ε-caprolactone; thiirane compounds such as ethylene sulfide and thioepichlorohydrin; thiethane compounds such as 1,3-propyne sulfide and 3,3-dimethyl thiethane; cyclic thioether compounds such as tetrahydrothiophene derivatives; vinyl ether compounds such as ethylene glycol divinyl ether, alkylvinyl ether, 2-chloroethylvinyl ether, 2-hydroxyethylvinyl ether, triethylene glycol divinyl ether, 1,4-cyclohexane dimethanol divinyl ether, hydroxybutylvinyl ether and propenyl ether of propylene glycol; spiro ortho ester compounds obtained by a reaction between an epoxy compound and lactone; ethylene unsaturated compounds such as styrene, vinylcyclohexene, isobutylene and polybutadiene; and silicones.

The cationically polymerizable composition according to the present invention can be used in combination further with, as required, a radically polymerizable organic compound and an energy beam-sensitive radical polymerization initiator.

The radically polymerizable organic compound which can be used in the present invention is a radically polymerizable organic compound which is made into a high-molecular compound or becomes crosslinked by energy beam irradiation under the presence of an energy beam-sensitive radical polymerization initiator. It is preferred that the radically polymerizable organic compound which can be used in the present invention be a compound having at least one unsaturated double-bond in one molecule.

Examples of such radically polymerizable organic compound include acrylate compounds, methacrylate compounds, allyl urethane compounds, unsaturated polyester compounds and styrene compounds.

Among such radically polymerizable organic compounds, compounds having a (meta) acrylic group are preferred for the easiness in synthesis thereof, acquisition and handling. Examples thereof include epoxy(meta)acrylate, urethane (meta)acrylate, polyester(meta)acrylate, polyether(meta) acrylate and (meta)acrylic ester of alcohols.

Here, epoxy(meta) acrylate refers to, for example, an acrylate which can be obtained by reacting a conventionally known aromatic epoxy resin, alicyclic epoxy resin, aliphatic epoxy resin or the like with (meta)acrylic acid. Among these epoxy(meta)acrylates, (meta)acrylate of aromatic epoxy resin is particularly preferred, which (meta) acrylate can be obtained by reacting a polyhydric phenol having at least one aromatic nucleus or polyglycidyl ether of an alkylene oxide adduct thereof with (meta)acrylic acid. Examples of such (meta)acrylate include (meta)acrylates which can be obtained by reacting a glycidyl ether, which can be obtained by reacting bisphenol A or an alkylene oxide adduct thereof with epichlorohydrin, with (meta)acrylic acid; and (meta) acrylates which can be obtained by reacting epoxy novolak resin with (meta)acrylic acid.

Examples of the preferred urethane(meta)acrylate include (meta)acrylates which can be obtained by reacting one or more hydroxyl group-containing polyesters or hydroxyl group-containing polyethers with a hydroxyl group-containing (meta)acrylic ester and an isocyanates; and (meta)acrylates which can be obtained by reacting a hydroxyl group-containing (meta)acrylic ester with an isocyanates.

As the hydroxyl group-containing polyester used here, hydroxyl group-containing polyesters which can be obtained by reacting one or more aliphatic polyhydric alcohols with one or more polybasic acids are preferred, and examples of the aliphatic polyhydric alcohol include 1,3-butanediol, 1,4-butanediol, 1,6-hexanediol, diethylene glycol, triethylene glycol, neopentylglycol, polyethylene glycol, polypropylene glycol, trimethylolpropane, glycerine, pentaerythritol and dipentaerythritol. Examples of the polybasic acid include adipic acid, terephthalic acid, anhydrous phthalic acid and trimellitic acid.

As the hydroxyl group-containing polyether, hydroxyl group-containing polyethers which can be obtained by adding one or more alkylene oxides to an aliphatic polyhydric alcohol are preferred, and examples of the aliphatic polyhydric alcohol include the same compounds as exemplified in the above. Examples of the alkylene oxide include ethylene oxide and propylene oxide.

As the hydroxyl group-containing (meta)acrylic ester, hydroxyl group-containing (meta)acrylic esters which can be obtained by an esterification reaction of an aliphatic polyhydric alcohol with (meta)acrylic acid are preferred, and examples of the aliphatic polyhydric alcohol include the same compounds as exemplified in the above.

Among such hydroxyl group-containing (meta) acrylic acids, hydroxyl group-containing (meta)acrylic esters which can be obtained by an esterification reaction of an aliphatic dihydric alcohol with (meta) acrylic acid are particularly preferred, and an example thereof include 2-hydroxyethyl (meta)acrylate.

As the isocyanates, compounds having one or more isocyanate groups in the molecule are preferred, and divalent isocyanate compounds such as tolylene diisocyanate, hexamethylene diisocyanate and isoholon diisocyanate are particularly preferred.

As the polyester (meta) acrylate, polyester (meta) acrylates which can be obtained by reacting a hydroxyl group-containing polyester with (meta)acrylic acid are preferred. As the hydroxyl group-containing polyester used here, hydroxyl group-containing polyesters which can be obtained by an esterification reaction of one or more aliphatic polyhydric alcohols with one or more monobasic acids, polybasic acids and phenols are preferred. Examples of the aliphatic polyhydric alcohol include the same compounds as exemplified in the above. Examples of the monobasic acid include formic acid, acetic acid, butylcarboxylic acid and benzoic acid. Examples of the polybasic acid include adipic acid, terephthalic acid, anhydrous phthalic acid and trimellitic acid. Examples of the phenols include phenol, p-nonylphenol and bisphenol A. As the polyether(meta)acrylate, polyether (meta)acrylates which can be obtained by reacting a hydroxyl group-containing polyether with a (meta)acrylic acid are preferred. As the hydroxyl group-containing polyether used here, hydroxyl group-containing polyethers which can be obtained by adding one or more alkylene oxides to an aliphatic polyhydric alcohol are preferred. Examples of the aliphatic polyhydric alcohol include the same compounds as exemplified in the above. Examples of the alkylene oxide include ethylene oxide and propylene oxide.

As the (meta)acrylic ester of alcohols, (meta)acrylates which can be obtained by reacting an aromatic or aliphatic alcohol having at least one hydroxyl group in the molecule and alkylene oxide adduct thereof with (meta)acrylic acid are preferred. Examples thereof include 2-ethylhexyl(meta) acrylate, 2-hydroxyethyl(meta) acrylate, 2-hydroxypropyl (meta) acrylate, isoamyl(meta) acrylate, lauryl(meta) acrylate, stearyl(meta) acrylate, isooctyl(meta) acrylate, tetrahydrofurfuryl(meta) acrylate, isobonyl(meta) acrylate, benzyl (meta)acrylate, 1,3-butanediol di(meta)acrylate, 1,4-butanediol di(meta) acrylate, 1,6-hexanediol di(meta) acrylate, diethylene glycol di(meta)acrylate, triethylene glycol di(meta)acrylate, neopentyl glycol di(meta)acrylate, polyethylene glycol di(meta)acrylate, polypropylene glycol di(meta)acrylate, trimethylolpropane tri(meta)acrylate, pentaerythritoltetra(meta)acrylate, dipentaerythritol hexa(meta) acrylate and ε-caprolactone modified dipentaerythritol hexa (meta)acrylate.

Among these (meta)acrylates, poly(meta)acrylates of polyhydric alcohol are particularly preferred.

Examples of the commercially available products of these radically polymerizable organic compounds that are monofunctional include: Aronix M-101, M-102, M-111, M-113, M-117, M-152 and TO-1210 (the above are manufactured by TOAGOSEI Co., Ltd.); KAYARADTC-110S, R-564 and R-128H (the above are manufactured by Nippon Kayaku Co., Ltd.); and Viscoat 192, Viscoat 220, Viscoat 2311HP, Viscoat 2000, Viscoat 2100, Viscoat 2150, Viscoat 8F and Viscoat 17F (the above are manufactured by OSAKA ORGANIC CHEMICAL INDUSTRY LTD.).

Further, examples of the commercially available products of these radically polymerizable organic compounds that are multifunctional include: SA1002 (manufactured by Mitsubishi Chemical Corporation); Viscoat 195, Viscoat 230, Viscoat 260, Viscoat 215, Viscoat 310, Viscoat 214HP, Viscoat 295, Viscoat 300, Viscoat 360, Viscoat GPT, Viscoat 400, Viscoat 700, Viscoat 540, Viscoat 3000 and Viscoat 3700 (the above are manufactured by OSAKA ORGANIC CHEMICAL INDUSTRY LTD.); KAYARAD R-526, HDDA, NPGDA, TPGDA, MANDA, R-551, R-712, R-604, R-684, PET-30, GPO-303, TMPTA, THE-330, DPHA, DPHA-2H, DPHA-2C, DPHA-2I, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300 and R-205 (the above are manufactured by Nippon Kayaku Co., Ltd.); Aronix M-210, M-220, M-233, M-240, M-215, M-305, M-309, M-310, M-315, M-325, M-400, M-6200 and M-6400 (the above are manufactured by TOA-GOSEI Co. Ltd.); LIGHT-ACRYLATE BP-4EA, BP-4PA, BP-2EA, BP-2PA and DCP-A (the above are manufactured by KYOEISHA CHEMICAL Co., LTD.); New Frontier BPE-4, TEICA, BR-42M and GX-8345 (the above are manufactured by DAI-ICHI KOGYO SEIYAKU CO., LTD.); ASF-400 (manufactured by Nippon Steel Chemical Co., Ltd.); Ripoxy SP-1506, SP-1507, SP-1509, VR-77, SP-4010 and SP-4060 (the above are manufactured by SHOWA HIGH-POLYMER CO., LTD.); and NK Ester A-BPE-4 (manufactured by Shin-Nakamura Chemical Co., Ltd.).

These radically polymerizable organic compounds may be used by combining one or more thereof in accordance with the desired performance and it is preferred that not less than 50% by mass of the radically polymerizable organic substance (s) have a (meta)acrylic group in the molecule.

In cases where the radically polymerizable organic compound of the present invention is used, the content thereof is preferably not more than 200 parts by mass, particularly preferably 10 to 100 parts by mass, with respect to 100 parts by mass of cationically polymerizable organic compound.

The energy beam-sensitive radical polymerization initiator of the present invention can be any compound as long as it can initiate radical polymerization by being irradiated with an energy beam. Examples of the preferred compound include ketone compounds such as acetophenone compounds, benzyl compounds, benzophenone compounds and thioxanthone compounds.

Examples of the acetophenone compound include diethoxy acetophenone, 2-hydroxy-2-methyl-1-phenylpropane-1-on, 4'-isopropyl-2-hydroxy-2-methyl propiophenone, 2-hydroxymethyl-2-methyl propiophenone, 2,2-dimethoxy-1,2-diphenylethane-1-on, p-dimethylamino acetophenone, p-tert-butyl dichloroacetophenone, p-tert-butyl trichloroacetophenone, p-azidobenzal acetophenone, 1-hydroxycyclohexyl phenyl ketone, 2-methyl-1-[4-(methylthio)phenyl]-2-morpholinopropanone-1,2-benzyl-2-dimethylamino-1-(4-morpholinophenyl)-butanone-1, benzoin, benzoin methyl ether, benzoin ethyl ether, benzoin isopropyl ether, benzoin-n-butyl ether, benzoin isobutyl ether and 1-[4-(2-hydroxyethoxy)-phenyl]-2-hydroxy-2-methyl-1-propane-1-on.

Examples of the benzyl compound include benzyl and anisyl, and examples of the benzophenone compound include benzophenone, o-benzoyl benzoic acid methyl, Michler's ketone, 4,4'-bis-diethylamino benzophenone, 4,4'-dichlorobenzophenone and 4-benzoyl-4'-methyl diphenyl sulfide.

Examples of the thioxanthone compound include thioxanthone, 2-methylthioxanthone, 2-ethylthioxanthone, 2-chlorothioxanthone, 2-isopropyl thioxanthone and 2,4-diethylthioxanthone.

Examples of other energy beam-sensitive radical polymerization initiators include 2,4,6-trimethylbenzoyldiphenyl phosphine oxide and bis(cyclopentadienyl)-bis[2,6-difluoro-3-(pyrrole-1-yl) phenyl]titanium.

These energy beam-sensitive radical polymerization initiators may be used by combining one or more thereof in accordance with the desired performance.

The amount of the energy beam-sensitive radical polymerization initiator(s) with respect to the radically polymerizable organic compound may be any stoichiometrically required amount, and it is preferably 0.05 to 10% by mass, more preferably 0.1 to 10% by mass, with respect to the radically polymerizable organic compound. A cured product having a sufficient strength cannot be obtained when the content of the energy beam-sensitive radical polymerization initiator(s) exceeds 10% by mass, while a resin may not sufficiently cure when the content is less than 0.05% by mass.

When the amount of the cationic polymerization initiator(s) consisting of the onium salt compound according to the present invention is less than 0.01 parts by mass with respect to 100 parts by mass of the above-described cationically polymerizable organic compound, curing may be insufficient. On the other hand, when the amount of the cationic polymerization initiator(s) exceeds 10 parts by mass, it does not result in an increase in the effects and may rather have an adverse effect in the physical properties of the cured product. Therefore, the amount of the cationic polymerization initiator(s) is preferably 0.01 parts by mass to 10 parts by mass, and more preferably 0.1 parts by mass to 5 parts by mass.

Further, as other arbitrary component(s), various additives may be admixed in the cationically polymerizable composition according to the present invention. Examples of such various additives include: organic solvents; benzotriazole-, traizine- or benzoate-ultraviolet absorbing agents; phenolic, phosphorous or sulfuric antioxidants; antistatic agents consisting of a cationic surfactant, anionic surfactant, nonionic surfactant, amphoteric surfactant and the like; flame retardants such as halides, phosphoric ester compounds, phosphoric amide compounds, melamine compounds, fluorine resins or metal oxides, melamine (poly)phosphate and piperazine (poly) phosphate; hydrocarbon-, fatty acid-, aliphatic alcohol-, aliphatic ester-, aliphatic amide- or metallic soap-lubricants; coloring agents such as dyes, pigments, carbon black; silicic acid-inorganic additives such as fumed silica, fine particulate silica, silica rock, diatomaceous earths, clay, kaolin, diatomaceous earth, silica gel, calcium silicate, sericite, kaolinite, flint, feldspar powder, vermiculite, attapulgite, talc, mica, minnesotite, pyrophyllite and silica; fillers such as glass fibers and calcium carbonate; crystallizing agents such as nucleating agents and crystallization promoters; silane coupling agents; rubber elasticizers such as flexible (pre)polymers; sensitizing agents, for example, condensed polycyclic aromatic derivatives such as naphthalene derivatives, anthracene derivatives, phenanthrene derivatives, pyrene derivatives, naphthacene derivatives, perylene derivatives, pentacene derivatives, hexacene derivatives and heptacene derivatives, fluorene derivatives, naphthoquinone derivatives, anthraquinone derivatives, benzoin derivatives, xanthene derivatives, thioxanthene derivatives, xanthone derivatives, thioxanthone derivatives, coumarin derivatives, cyanine derivatives, merocyanine derivatives, acridine derivatives, indoline derivatives, azulene derivatives, porphyrin derivatives, phthalocyanine derivatives, benzothiazole derivatives, spiropyran derivatives and pigments exhibiting absorptions in the ultraviolet to near infrared region; organic compounds containing 2 or more hydroxyl groups in one molecule such as polyhydric alcohols, hydroxyl group-containing polyethers, hydroxyl group-containing polyesters and polyhydric phenols; thermoplastic high-molecular compounds; leveling agents; thickening agents; and stabilizers.

Further, in order to facilitate the dissolution of the cationic polymerization initiator into the cationically polymerizable compound, the cationic polymerization initiator may be used upon dissolving in an appropriate solvent (for example, propylene carbonate, carbitol, carbitol acetate, butyrolactone or the like) in advance. The cationically polymerizable composition according to the present invention can be prepared by a method in which a cationically polymerizable compound, cationic polymerization initiator and other arbitrary components are, for example, mixed, dissolved or kneaded.

By irradiation with an energy beam such as ultraviolet radiation, the cationically polymerizable composition according to the present invention can be cured to a dry-to-the-touch condition or a condition in which the composition is insoluble in a solvent, generally after 0.1 seconds to a several minutes. Any energy beam is suitable as long as it induces the decomposition of the cationic polymerization initiator; however, it is preferable to use a high-energy beam such as electromagnetic wave energy and electron beam having a wavelength of 2,000 to 7,000 angstrom, X-ray or radiation, which high-energy beam is obtained from an extra-high pressure mercury vapor lamp, high pressure mercury vapor lamp, medium-pressure mercury vapor lamp, low-pressure mercury vapor lamp, xenon lamp, carbon-arc lamp, metal-halide lamp, fluorescent lamp, tungsten-arc lamp, excimer lamp, germicidal lamp, excimer laser, nitrogen laser, argon ion laser, helium-cadmium laser, helium-neon laser, krypton ion laser, various diode lasers, YAG laser, luminous diode, CRT light source or the like.

The time of exposure to the energy beam varies depending on the strength of the energy beam, the thickness of the coated film and/or the cationically polymerizable organic compound; however, in general, 0.1 to 10 seconds is sufficient. However, a longer exposure time is preferred for those relatively thicker coated products. After 0.1 seconds to a several minutes after the energy beam irradiation, most compositions becomes dried to the touch by cationic polymerization; however, there are cases where it is preferred to also employ heating or a thermal energy provided by a thermal head or the like in order to facilitate the cationic polymerization.

Examples of other applications of the salt compound according to the present invention include the use thereof as a photo-acid generator of a photo-sensitive resist composition and as an energy beam-sensitive cationic polymerization initiator of a resin composition for optical stereolithography. Such photo-acid generator is used by mixing with a resist base resin. Here, a resist base resin refers to a resin whose solubility to a developer is changed by the action of an acid.

As such resist base resin, structures having a small extinction coefficient at the wavelength of active energy beam and a high resistance to etching are preferred. Examples thereof include copolymers formed by components selected from polyhydroxystyrene and derivatives thereof, polyacrylic acid and derivatives thereof, polymethacrylic acid and derivatives thereof, and hydroxystyrene, acrylic acid, methacrylic acid and derivatives thereof; copolymers having at least three components selected from cycloolefin and derivatives thereof, anhydrous maleic acid, and acrylic acid and derivatives thereof; copolymers having at least three components selected from cycloolefin and derivatives thereof, maleimide, and acrylic acid and derivatives thereof; and high-molecular polymers in which one or more high-molecular polymers selected from the group consisting of polynorborene and ring-opened metathesis polymer is/are partially substituted by an acid-unstable group having an ability to control alkali solubility.

Detailed specific examples of the resist base resin include, for example, the following Formulae described in Japanese Unexamined Patent Application Publication No. 2003-192665:

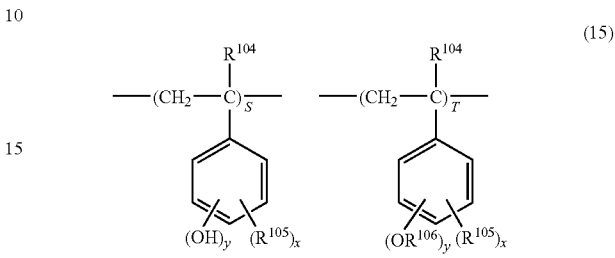

(wherein, $R^{104}$ represents a hydrogen atom or a methyl group;

$R^{105}$ represents a $C_1$-$C_8$ linear, branched, or cyclic alkyl group;

x is 0 or a positive integer and y is a positive integer, provided that x and y satisfy $x+y \leqq 5$;

$R^{106}$ represents an acid-unstable group;

S and T each represents a positive integer, provided that S and T satisfy $0 < T/(S+T) \leqq 0.8$);

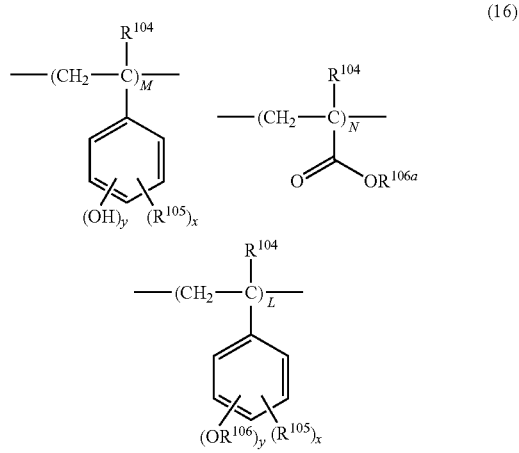

(wherein, $R^{104}$ represents a hydrogen atom or a methyl group;

$R^{105}$ represents a $C_1$-$C_8$ linear, branched, or cyclic alkyl group;

$R^{106}$ represents an acid-unstable group;

$R^{106a}$ represents a hydrogen atom or an acid-unstable group, provided that at least a part thereof is an acid-unstable group;

x is 0 or a positive integer and y is a positive integer, provided that x and y satisfy $x+y \leqq 5$;

M and N are each a positive integer and L is 0 or a positive integer, provided that M, N and L satisfy $0 < N/(M+N+L) \leqq 0.5$ as well as $0 < (N+L)/(M+N+L) \leqq 0.8$);

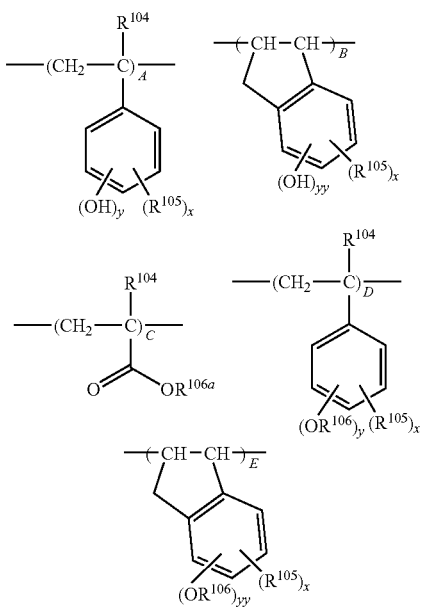

(17)

(wherein, $R^{104}$ represents a hydrogen atom or a methyl group;

$R^{105}$ represents a $C_1$-$C_8$ linear, branched, or cyclic alkyl group;

$R^{106}$ represents an acid-unstable group;

$R^{106a}$ represents a hydrogen atom or an acid-unstable group, provided that at least a part thereof is an acid-unstable group;

x is 0 or a positive integer and y is a positive integer, provided that x and y satisfy x+y≦5;

yy is 0 or a positive integer, provided that x+yy≦5;

A and B are each a positive integer and C, D and E are each 0 or a positive integer, provided that A, B, C, D and E satisfy 0<(B+E)/(A+B+C+D+E)≦0.5 as well as 0<(C+D+E)/(A+B+C+D+E)≦0.8);

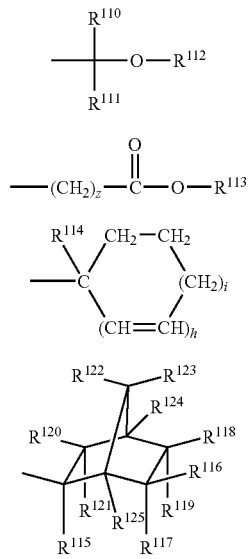

(18)

(19)

(20)

(21)

(wherein, $R^{110}$ and $R^{111}$ each represents a hydrogen atom or a $C_1$-$C_{18}$ linear, branched or cyclic alkyl group and $R^{112}$ represents a $C_1$-$C_{18}$ monovalent hydrocarbon radical which optionally has a hetero atom, which $R^{110}$ and $R^{111}$, $R^{110}$ and $R^{112}$, $R^{111}$ and $R^{112}$ may form a ring and in such case, $R^{110}$, $R^{111}$ and $R^{112}$ each represents a $C_1$-$C_{18}$ linear or branched alkylene group;

$R^{113}$ is a $C_4$-$C_{20}$ tertiary alkyl group, a trialkylsilyl group in which each alkyl group is $C_1$-$C_6$, a $C_4$-$C_{20}$ oxoalkyl group or a group represented by the above general Formula (18);

z is an integer of 0 to 6;

$R^{114}$ represents a $C_1$-$C_8$ linear, branched or cyclic alkyl group or $C_6$-$C_{20}$ aryl group which is optionally substituted;

h is 0 or 1 and i is any of 0, 1, 2 and 3, provided that h and i satisfy 2 h+i=2 or 3;

$R^{115}$ represents a $C_1$-$C_8$ linear, branched or cyclic alkyl group or $C_6$-$C_{20}$ aryl group which is optionally substituted;

$R^{116}$ to $R^{125}$ each independently represents a hydrogen atom or a $C_1$-$C_{15}$ monovalent hydrocarbon radical which optionally has a hetero atom, which $R^{116}$ to $R^{125}$ may each other form a ring and in such case, $R^{116}$ to $R^{125}$ each independently represents a $C_1$-$C_{15}$ divalent hydrocarbon radical which optionally has a hetero atom, and which $R^{116}$ to $R^{125}$ may directly bind each other between two adjacent carbon atoms to form a double-bond); and the following Formulae described in Japanese Unexamined Patent Application Publication No. 2004-323704:

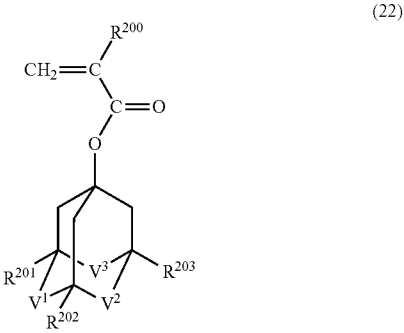

(22)

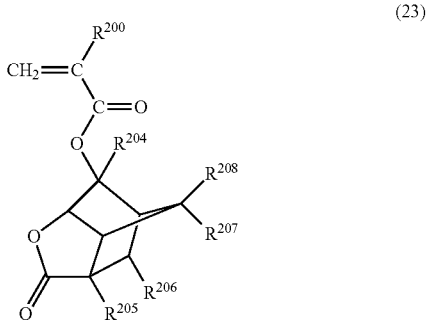

(23)

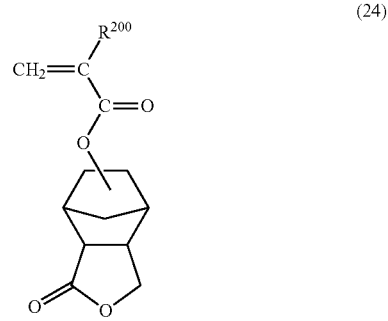

(24)

(25)

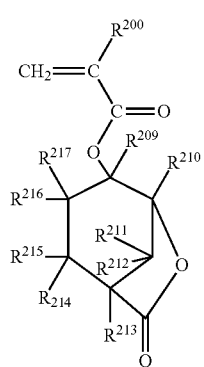

(26)

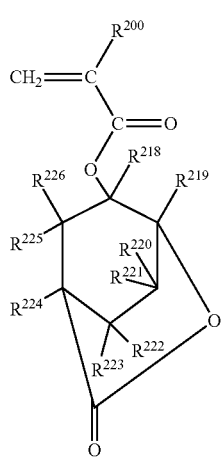

(27)

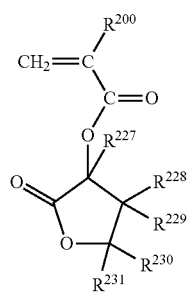

(28)

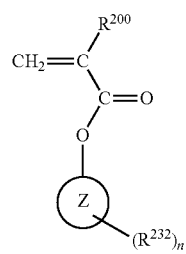

(wherein, $R^{200}$ represents a hydrogen atom or a methyl group;

$R^{201}$ to $R^{231}$, the same or different, represent a hydrogen atom, an alkyl group, a hydroxyl group which is optionally protected by a protecting group, a hydroxy alkyl group which is optionally protected by a protecting group or a carboxyl group which is optionally protected by a protecting group;

$V^1$ to $V^3$, the same or different, —$CH_2$—, —CO— or —COO—, provided that at least one of $V^1$ to $V^3$ is —COO—;

ring Z represents a $C_6$-$C_{20}$ alicyclic hydrocarbon ring which optionally has a substituent;

$R^{232}$ is a substituent bound to the ring Z and, the same or different, represents an oxo group, a hydroxyl group which is optionally protected by a protecting group, a hydroxy alkyl group which is optionally protected by a protecting group, a carboxyl group which is optionally protected by a protecting group, an amino group which is optionally protected by a protecting group, or a sulfonic acid group which is optionally protected by a protecting group; and n represents an integer of 1 to 3).

In cases where the onium salt compound according to the present invention is used as a photo-acid generator in a photo-sensitive resist composition, other photo-acid generators and/or photo-reactive sensitizing agent(s) may be used in combination. From the viewpoint of securing the sensitivity and the developing properties as a resist, the amount of the photo-acid generator(s) in the photo-sensitive resist composition with respect to 100 parts by mass of resist base resin is generally 0.1 to 10 parts by mass, and preferably 0.5 to 7 parts by mass.

A photo-sensitive resist composition using the salt compound according to the present invention is usually prepared by dissolving the compound into a solvent in such a manner that the entire solid content at the time of use is usually 5 to 50% by mass, preferably 10 to 25% by mass, followed by, for example, filtering the thus obtained solution through a filter having a pore diameter of about 0.2 μm.

Such photo-sensitive resist composition is particularly useful as a chemically amplified resist. A chemically amplified resist refers to a resist in which acid-dissociating groups in the base resin dissociates by the action of an acid generated from a photo-acid generator by exposure to a light to generate acidic functional groups, preferably carboxyl group, thereby increasing the solubility of the exposed regions of the resist into an alkaline developer, so that the exposed regions become dissolved and removed by the alkaline developer to yield a positive resist pattern.

The light source used in the exposure of photo-sensitive resist composition is appropriately selected from, for example, visible light ray, ultraviolet rays, far-ultraviolet ray, X-ray and charged particle radiation, depending on the type of the photo-acid generator used. Specific examples thereof include far-ultraviolet ray such as KrF excimer laser (wavelength at 248 nm) or ArF excimer laser (wavelength at 193 nm), X-ray such as synchrotron radiation and charged particle radiation such as an electron beam.

Examples of the application of photo-sensitive resist composition containing the cationic polymerization initiator according to the present invention, cationically polymerizable composition and the salt compound according to the present invention include the use as an ink, protective film (protective layer), coating agent, adhesive agent, insulation material, structural material, optical stereolithography, optical film, color filter, FRP, photoresist for semiconductor and the use in patterning of an ink jet printing head, as well as the use in the formation of these.

EXAMPLES

The present invention will be described in the following by way of Examples, Evaluation Examples, Comparative Evaluation Examples and the like; however, the present invention is not restricted thereto.

Example 1

Production of a Lithium Salt of the Anion Compound No. 1 (Example Compound 1)

To a 200 mL flask which had been sufficiently dried under argon atmosphere, 30 mL of anhydrous pentane and 22.1 g (0.10 mol) of 4-bromo-2,6,-difluoroanisole were added and the mixture was cooled to −78° C. in a dry ice/acetone bath. Dropped thereto over 50 minutes was 61.2 mL of 1.6 mol/L n-butyl lithium hexane solution and the thus obtained mixture was subsequently stirred for 5 hours at −78° C. Thereto dropped over 30 minutes was 24.5 mL of 1 mol/L boron trichloride/hexane solution and the thus obtained reaction solution was stirred for 5 hours at −20° C. To this reaction solution, 80 mL of water was slowly added to hydrolyze the reaction mixture and the formed crystals were collected, which were then washed with 80 mL of hexane and 80 mL of water to obtain 13.0 g of tetrakis(3,5-difluoro-4-methoxyphenyl) lithium borate having an HPLC purity of 98.8% (Yield: 90%). The thus obtained product was subjected to measurements by $^1$H-NMR (heavy methanol solvent) and MALDI TOF-MS to confirm that it was the desired product.

(Measurement Results)
$^1$H-NMR (shift; ppm: multiplicity: number of protons)
(3.8: s: 12) (6.5-6.6: m: 8)
MALDI TOF-MS (m/z)
mass: 583.25 (Theoretical value: 583.27)

Example 2

Production of a Lithium Salt of the Anion Compound No. 3 (Example Compound 2)

To a 200 mL flask which had been sufficiently dried under argon atmosphere, 30 mL of anhydrous pentane and 25.9 g (0.10 mol) of 4-bromo-2,3,5,6-tetrafluoroanisole were added and the mixture was cooled to −78° C. in a dry ice/acetone bath. Dropped thereto over 50 minutes was 61.2 mL of 1.6 mol/L n-butyl lithium hexane solution and the thus obtained mixture was subsequently stirred for 5 hours at −78° C. Thereto dropped over 30 minutes was 24.5 mL of 1 mol/L boron trichloride/hexane solution. The thus obtained reaction solution was stirred while being restored to room temperature, followed by further stirring for 12 hours after the reaction solution was restored to room temperature. To this reaction solution, 80 mL of water was slowly added to hydrolyze the reaction mixture and the formed crystals were collected, which were then washed with 80 mL of hexane and 80 mL of water to obtain 12.2 g of tetrakis(2,3,5,6-tetrafluoro-4-methoxyphenyl) lithium borate having an HPLC purity of 98.1% (Yield: 68%). The thus obtained product was subjected to measurements by $^1$H-NMR (heavy methanol solvent) and MALDI TOF-MS to confirm that it was the desired product.

(Measurement Results)
$^1$H-NMR (shift; ppm: multiplicity: number of protons)
(3.8: s: 12)
MALDI TOF-MS (m/z)
mass: 727.21 (Theoretical value: 727.19)

Example 3

Production of a Lithium Salt of the Anion Compound No. 15 (Example Compound 3)

To a 200 mL flask which had been sufficiently dried under argon atmosphere, 30 mL of anhydrous pentane and 28.1 g (0.10 mol) of 4-butylthio-3,5-difluorobromobenzene were added and the mixture was cooled to −78° C. in a dry ice/acetone bath. Dropped thereto over 50 minutes was 61.2 mL of 1.6 mol/L n-butyl lithium hexane solution and the thus obtained mixture was subsequently stirred for 5 hours at −78° C. Thereto dropped over 30 minutes was 24.5 mL of 1 mol/L boron trichloride/hexane solution and the thus obtained reaction solution was stirred for 5 hours at −20° C. To this reaction solution, 80 mL of water was slowly added to hydrolyze the reaction mixture, and oil and water were separated. The thus obtained organic phase was washed twice with 80 mL of water. Further, the mixture of the separated aqueous phase and the washing water used to wash the organic phase was extracted three times with 80 mL of ether. The organic phase washed with water was mixed with the ether phase extracted from the mixture of the aqueous phase and the washing water used to wash the organic phase, and the solvent was removed under reduced pressure to obtain 13.5 g of tetrakis(3,5-difluoro-4-butylthiophenyl) lithium borate having an HPLC purity of 98.4% (Yield: 84%). The thus obtained product was subjected to measurements by $^1$H-NMR (heavy methanol solvent) and MALDI TOF-MS to confirm that it was the desired product.

(Measurement Results)
$^1$H-NMR (shift; ppm: multiplicity: number of protons)
(0.9: t: 12) (1.4: m: 8) (1.6: m: 8) (2.9: t: 12) (6.5: m: 8)
MALDI TOF-MS (m/z)
mass: 815.82 (Theoretical Value: 815.85)

Example 4

Production of Aryl Sulfonium Salt Compound (Example Compound 4 of the Formula Below)

To a 200 mL flask, 9.00 g (0.014 mol) of aryl sulfonium sulfate, 8.3 g (0.014 mol) of Example Compound 1 obtained in the above Example 1, 80 g of methylene chloride and 80 g of water were added and the mixture was stirred for 1 hour at room temperature. The resultant was then transferred to a separatory funnel to remove the aqueous phase. The organic phase was washed three times with 50 g of water and the solvent was removed therefrom using an evaporator to obtain 15.0 g of the desired product in the form of glassy-solid (Yield: 95%). The thus obtained product was subjected to measurements by $^1$H-NMR (heavy chloroform solvent) and MALDI TOF-MS to confirm that it was the desired product.

Example Compound 4

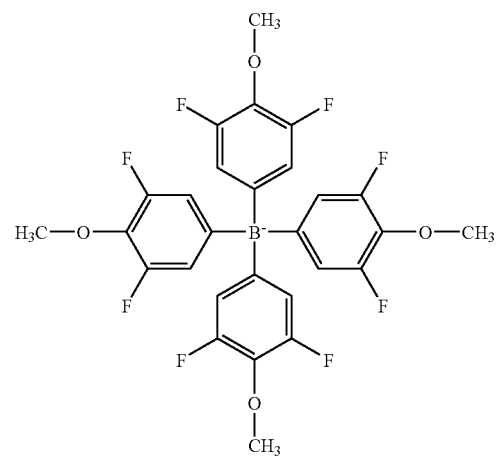

43

-continued

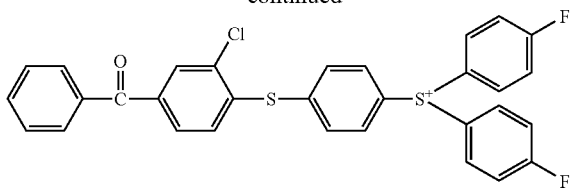

(Measurement Results)
¹H-NMR (shift; ppm: multiplicity: number of protons)
(3.8: s: 12) (6.6-6.7: m: 8) (7.3-7.4: m: 8) (7.4-7.5: m: 4) (7.5-7.6: m: 2) (7.6-7.7: m: 3) (7.8: d: 2) (7.9: d: 1)
MALDI TOF-MS
cation mass: 546.11 (Theoretical Value: 546.08)
anion mass: 583.25 (Theoretical Value: 583.27)

Example 5

Production of Aryl Sulfonium Salt Compound
(Example Compound 5 of the Formula Below)

The desired product in the form of glassy-solid was obtained in an amount of 16.9 g (Yield: 95%) in the same manner as in the above Example 4 except that Example Compound 2 obtained in the above Example 2 was used in place of the compound obtained in the above Example 1. The thus obtained product was subjected to measurements by ¹H-NMR (heavy chloroform solvent) and MALDI TOF-MS to confirm that it was the desired product.

Example Compound 5

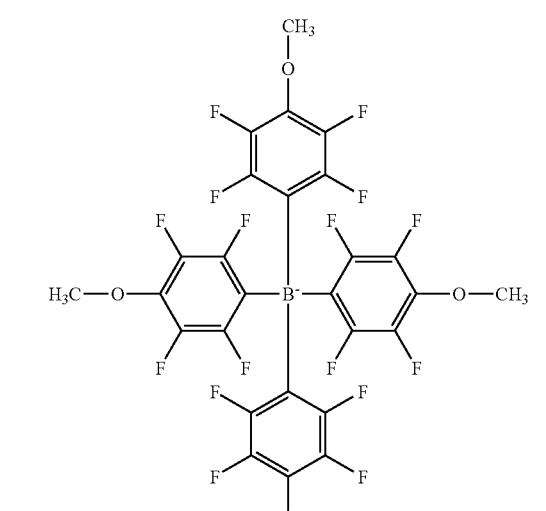

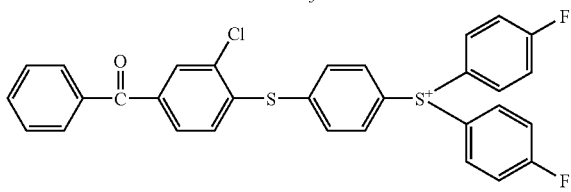

44

(Measurement Results)
¹H-NMR (shift; ppm: multiplicity: number of protons)
(3.8: s: 12) (7.2-7.3: m: 8) (7.4-7.5: m: 4) (7.5-7.6: m: 2) (7.6-7.7: m: 3) (7.8: d: 2) (7.9: d: 1)
MALDI TOF-MS
cation mass: 546.11 (Theoretical Value: 546.08)
anion mass: 727.21 (Theoretical Value: 727.19)

Example 6

Production of Aryl Sulfonium Salt Compound
(Example Compound 6 of the Formula Below)

The desired product in the form of glassy-solid was obtained in an amount of 18.3 g (Yield: 96%) in the same manner as in the above Example 4 except that Example Compound 3 obtained in the above Example 3 was used in place of the compound obtained in the above Example 1. The thus obtained product was subjected to measurements by ¹H-NMR (heavy chloroform solvent) and MALDI TOF-MS to confirm that it was the desired product.

Example Compound 6

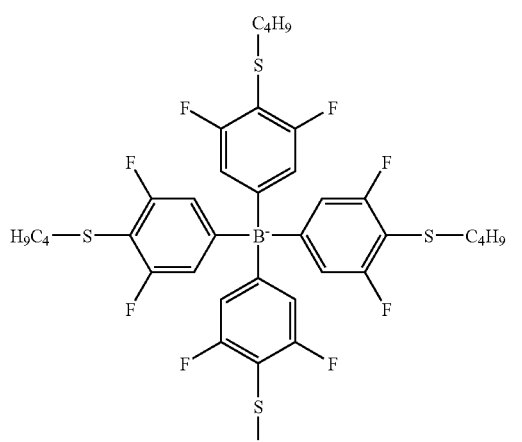

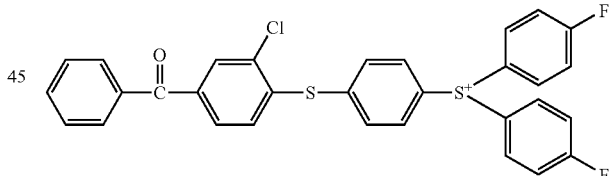

(Measurement Results)
¹H-NMR (shift; ppm: multiplicity: number of protons)
(0.9: t: 12) (1.3-1.4: m: 8) (1.5-1.6: m: 8) (2.9: t: 8) (6.5-6.7: m: 8) (7.3-7.4: m: 8) (7.4-7.5: m: 4) (7.5-7.6: m: 2) (7.6-7.7: m: 3) (7.8: d: 2) (7.94: d: 1)
MALDI TOF-MS
cation mass: 546.11 (Theoretical Value: 546.08)
anion mass: 815.82 (Theoretical Value: 815.85)

Example 7

Production of Aryl Sulfonium Salt Compound
(Example Compound 7 of the Formula Below)

The desired product in the form of glassy-solid was obtained in an amount of 14.5 g (Yield: 95%) in the same manner as in the above Example 4 except that 8.5 g of (4-benzoyl phenyl thio)phenyl bis(4-fluorophenyl)sulfonium sulfate was used as the aryl sulfonium sulfate. The thus obtained product was subjected to measurements by $^1$H-NMR (heavy chloroform solvent) and MALDI TOF-MS to confirm that it was the desired product.

Example Compound 7

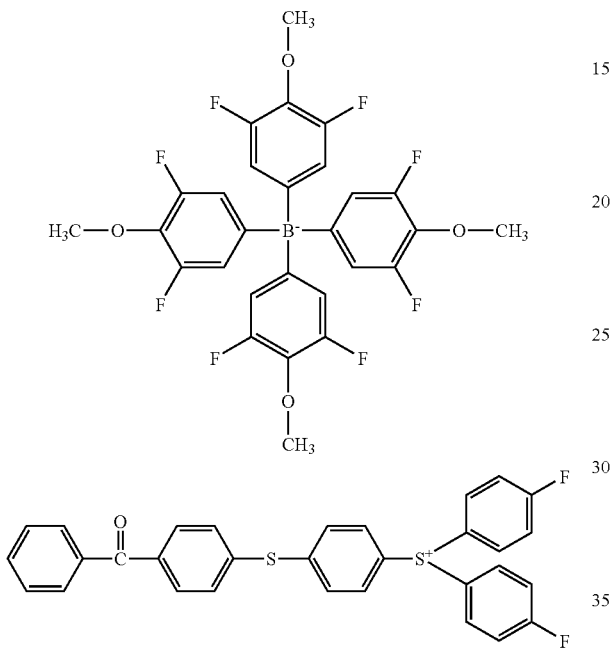

(Measurement Results)

$^1$H-NMR (shift; ppm: number of protons)

(3.86: s: 12) (6.64-6.69: m: 8) (7.31-7.39: m: 8) (7.47-7.64: m: 9) (7.77-7.84: m: 4)

MALDI TOF-MS cation mass: 511.13 (Theoretical Value: 511.64)

anion mass: 583.25 (Theoretical Value: 583.27)

Example 8

Production of Aryl Sulfonium Salt Compound
(Example Compound 8 of the Formula Below)

To a 200 mL flask which had been sufficiently dried under argon atmosphere, 10.0 g (0.024 mol) of aryl sulfonium sulfate, 14.6 g (0.024 mol) of Example Compound 1 obtained in the above Example 1, 80 g of methylene chloride and 80 g of water were added and the mixture was stirred for 1 hour at room temperature. Oil and water were separated and the organic phase was washed three times with 50 mL of water. The solvent was evaporated under reduced pressure to obtain a glassy solid in an amount of 20.8 g (Yield 96%). The thus obtained solid was subjected to measurements by $^1$H-NMR (heavy chloroform solvent) and MALDI TOF-MS to confirm that it was the desired product.

Example Compound 8

(Measurement Results)

$^1$H-NMR (shift; ppm: multiplicity: number of protons)

(7.36: dd: 4) (7.26: dd: 4) (6.66-6.61: m: 8) (3.85: s: 12)

MALDI TOF-MS (m/z)

cation mass: 317.40 (Theoretical Value: 317.36)

anion mass: 583.25 (Theoretical Value: 583.27)

Example 9

Production of Aryl Sulfonium Salt Compound
(Example Compound 9 of the Formula Below)

To a 200 mL flask which had been sufficiently dried under argon atmosphere, 10.0 g (0.028 mol) of aryl sulfonium sulfate, 16.9 g (0.028 mol) of Example Compound 1 obtained in the above Example 1, 80 g of methylene chloride and 80 g of water were added and the mixture was stirred for 1 hour at room temperature. Oil and water were separated and the organic phase was washed three times with 50 mL of water. The solvent was evaporated under reduced pressure to obtain a glassy solid in an amount of 22.5 g (Yield 96%). The thus obtained solid was subjected to measurements by $^1$H-NMR (heavy chloroform solvent) and MALDI TOF-MS to confirm that it was the desired product.

Example Compound 9

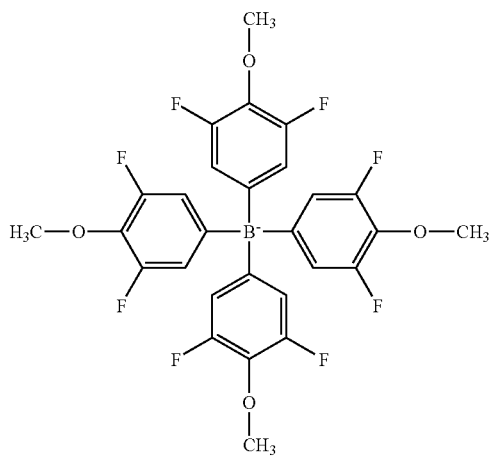

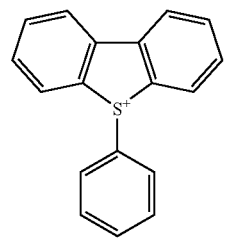

(Measurement Results)
$^1$H-NMR (shift; ppm: multiplicity: number of protons)
(8.06: d: 2) (7.82-7.73: m: 4) (7.66-7.56: m: 3) (7.47-7.28: m: 4) (6.68-6.63: m: 8) (3.84: s: 12) (7.47-7.28: m: 4)
MALDI TOF-MS
cation mass: 261.48 (Theoretical Value: 261.37)
anion mass: 583.25 (Theoretical Value: 583.27)

Example 10

Production of Alkyl Sulfonium Salt Compound
(Example Compound 10 of the Formula Below)

To a 300 mL flask which had been sufficiently dried under argon atmosphere, 33.9 g (0.37 mol) of crotyl chloride and 153 g of methanol were added. Dropped thereto while cooling with water was 23.5 g (0.27 mol) of tetrahydrothiophene and the mixture was stirred for 2 hours. Further added thereto was 121.23 g (0.2 mol) of Example Compound 1 obtained in the above Example 1, and the thus obtained mixture was stirred for 6 hours at room temperature. After removing the solvent under reduced pressure, the resultant was dissolved into 300 g of methylene chloride, which was then washed five times with 300 g of ion-exchanged water. After removing the solvent from the organic phase under reduced pressure, the resultant was dissolved into 85 g of methyl isobutyl ketone. Isopropyl ether in an amount of 600 g was added thereto to obtain 105 g (Yield: 73%) of white powder. The thus obtained powder was subjected to measurements by $^1$H-NMR (heavy chloroform solvent) and MALDI TOF-MS to confirm that it was the desired product.

Example Compound 10

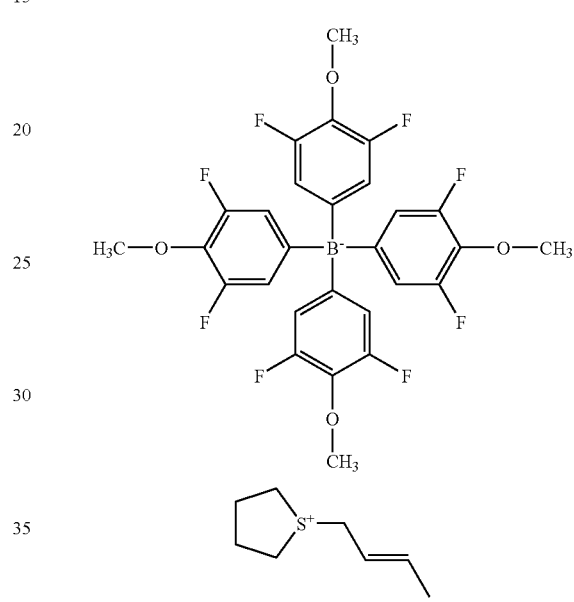

(Measurement Results)
$^1$H-NMR (shift; ppm: multiplicity: number of protons)
(6.75-6.71: m: 8) (5.99-5.90: m: 1) (5.28-5.20:m: 1) (3.92: s: 12) (3.46: dd: 2) (3.10-3.02: m: 4) (2.14-2.07: m: 4) (1.88-1.62: m: 3)
MALDI TOF-MS
cation mass: 143.35 (Theoretical Value: 143.27)
anion mass: 583.25 (Theoretical Value: 583.27)

Example 11

Production of Alkyl Sulfonium Salt Compound
(Example Compound 11 of the Formula Below)

The desired product in the form of while powder was obtained in an amount of 113.4 g (Yield: 77%) in the same manner as in the above Example 10 except that 1-chloro-3-methyl-2-butene was used in place of crotyl chloride. The thus obtained product was subjected to measurements by $^1$H-NMR (heavy chloroform solvent) and MALDI TOF-MS to confirm that it was the desired product.

Example Compound 11

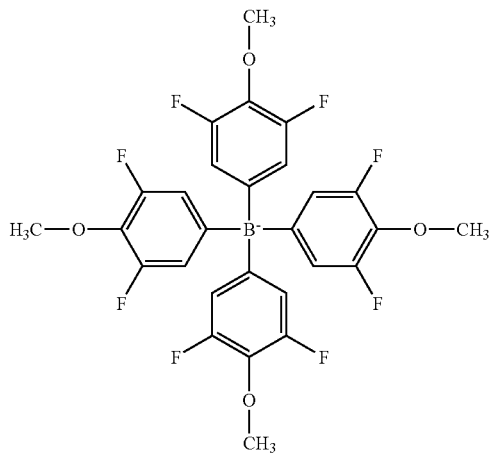

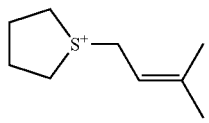

(Measurement Results)
$^1$H-NMR (shift; ppm: multiplicity: number of protons)
(6.72-6.69: m: 8) (5.02: t: 1) (3.91: s: 12) (3.47: d: 2) (3.17-2.90: m: 4) (2.13-2.08: m: 4) (1.83: s: 3) (1.69: s: 3)
MALDI TOF-MS
cation mass: 157.33 (Theoretical Value: 157.30)
anion mass: 583.25 (Theoretical Value: 583.27)

Example 12

Production of Aryl Iodonium Salt Compound
(Example Compound 12 of the Formula Below)

To a 200 mL flask which had been sufficiently dried under argon atmosphere, 10.0 g (0.020 mol) of aryl iodonium sulfate, 12.3 g (0.020 mol) of Example Compound 1 obtained in the above Example 1, 80 g of methylene chloride and 80 g of water were added and the mixture was stirred for 1 hour at room temperature. Oil and water were separated and the organic phase was washed three times with 50 mL of water. The solvent was evaporated under reduced pressure to obtain a glassy solid in an amount of 18.7 g (Yield 94%). The thus obtained solid was subjected to measurements by $^1$H-NMR (heavy chloroform solvent) and MALDI TOF-MS to confirm that it was the desired product.

Example Compound 12

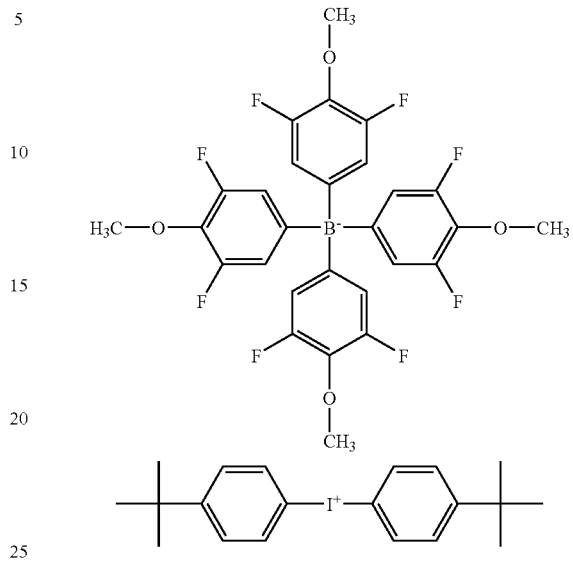

(Measurement Results)
$^1$H-NMR (shift; ppm: multiplicity: number of protons)
(7.57: dd: 4) (7.42: dd: 4) (6.76-6.71: m: 8) (3.86: s: 12) (1.27: s: 18)
MALDI TOF-MS
cation mass: 393.39 (Theoretical Value: 393.33)
anion mass: 583.25 (Theoretical Value: 583.27)

Example 13

Production of Photo-Cationically Polymerizable Compositions 1 to 3 and Evaluation 1

Mixed into 100 g of 3,4-epoxycyclohexylmethyl-3,4-epoxycyclohexylcarboxylate was 4.0 mmol of each of the Example Compounds 4 to 6 obtained in the above Examples 4 to 6, and the photo-cationically polymerizable compositions 1 to 3 were obtained. These compositions were each coated onto a glass plate to a thickness of about 10 μm using a bar coater (No. 6). Upon drying for 5 minutes at 80° C., the spectral sensitivity of the above photo-polymerizable compositions at 365 nm was measured using a monochromator, CT-25CP, manufactured by JASCO Corporation.

This monochromator CT-25CP is equipped with a 500 W extra-high pressure mercury vapor lamp and diffraction grating and capable of separating monochromatic light having a wavelength of 365 nm. It is also capable of adjusting the irradiation energy using a shutter which allows irradiation of the monochromatic light for a set time. Provided immediately below the shutter's light existing slit is a movable stage onto which the glass plates coated with each of the above-described cationically polymerizable compositions can be placed. This movable stage moves in conjunction with the shutter, thereby enabling the irradiation of energy onto the cationically polymerizable compositions at 13 different levels. After baking the irradiated glass plates coated with each of the cationically polymerizable compositions for 10 minutes at 80° C., they were developed with methanol, rinsed with xylene and dried. The spectral sensitivity was determined at a light having a wavelength of 365 nm based on the minimum curing energy required for curing which was estimated by the number of cured films remaining on the glass plate and the amount of outgoing light/shutter opening time. The results are shown in Table 1.

Comparative Example 1

The photo-cationically polymerizable compositions for comparison 1 to 3 were obtained in the same manner as in the above Example 13 except that, in place of the Example Compounds 4 to 6 obtained in Examples 4 to 6, a salt between a cation of the same kind and tetrakis(2,3,4,5,6-pentafluorophenyl)borate (Comparative Example Compound 1), a salt between a cation of the same kind and antimony hexafluoride anion (Comparative Example Compound 2) or a salt between a cation of the same kind and phosphorus hexafluoride (Comparative Example Compound 3) was used. For these compositions for comparison 1 to 3, the spectral sensitivity was measured in the same manner as in Example 13. The results are shown in Table 1.

TABLE 1

| Cationically polymerizable composition | Cationic polymerization initiator | Anion component of cationic polymerization initiator | Sensitivity at 365 nm (mJ/cm$^2$) |
|---|---|---|---|
| 1 | Example Compound 4 | Anion Compound No. 1 | 13 |
| 2 | Example Compound 5 | Anion Compound No. 3 | 13 |
| 3 | Example Compound 6 | Anion Compound No. 15 | 25 |
| for comparison 1 | Comparative Example Compound 1 | tetrakis(2,3,4,5,6-pentafluorophenyl)borate | 42 |
| for comparison 2 | Comparative Example Compound 2 | antimony hexafluoride | 25 |
| for comparison 3 | Comparative Example Compound 3 | phosphorus hexafluoride | 235 |

Example 14

Production of Photo-Cationically Polymerizable Compositions 4 to 6 and Evaluation 2

Each of the Example Compounds 4 to 6 obtained in the above Examples 4 to 6 in an amount of 2.5 mmol was mixed by stirring with 100 g of alicyclic epoxy resin, 2021P (manufactured by DAICEL CHEMICAL INDUSTRIES, LTD.), to obtain the photo-cationically polymerizable compositions 4 to 6. The photo-polymerizable compositions were coated onto a glass plate provided with a spacer having a thickness of 1 mm. After sandwiching this by another glass plate, both sides of the thus obtained plate were each photo-irradiated for 200 seconds using a high pressure mercury vapor lamp (10 mW). After the photo-irradiation, the plate was heat-treated for 30 minutes in an oven at 100° C. The transmittance of the thus obtained cured product at 425 nm and at 450 nm was measured using a sample plate before the photo-irradiation as the reference to evaluate the coloring. The results are shown in Table 2.

Comparative Example 2

The photo-cationically polymerizable compositions for comparison 4 to 6 were obtained in the same manner as in the above Example 14 except that, in place of the Example Compounds 4 to 6 obtained in Examples 4 to 6, a salt between a cation of the same kind and tetrakis(2,3,4,5,6-pentafluorophenyl)borate (Comparative Example Compound 1), a salt between a cation of the same kind and antimony hexafluoride anion (Comparative Example Compound 2) or a salt between a cation of the same kind and phosphorus hexafluoride (Comparative Example Compound 3) was used. For these compositions for comparison 4 to 6, the coloring was evaluated in the same manner as in the Example 14. The results are shown in Table 2.

TABLE 2

| Cationically polymerizable composition | Cationic polymerization initiator | Anion component of cationic polymerization initiator | Transmittance at 425 nm (% T) | Transmittance at 450 nm (% T) |
|---|---|---|---|---|
| 4 | Example Compound 4 | Anion Compound No. 1 | 49.9 | 87.4 |
| 5 | Example Compound 5 | Anion Compound No. 3 | 48.7 | 86.5 |
| 6 | Example Compound 6 | Anion Compound No. 15 | 40.5 | 81.2 |
| for comparison 4 | Comparative Example Compound 1 | tetrakis(2,3,4,5,6-pentafluorophenyl)borate | 0.5 | 0.9 |
| for comparison 5 | Comparative Example Compound 2 | antimony hexafluoride | 1.0 | 1.6 |
| for comparison 6 | Comparative Example Compound 3 | phosphorus hexafluoride | 41.5 | 80.1 |

According to Tables 1 and 2 in the above, the followings were confirmed for the Example Compounds 4, 5 and 6, which are the salt compounds according to the present invention. The Example Compounds 4, 5 and 6 have a higher sensitivity, while being free from coloration, compared to the compound whose anion is tetrakis(2,3,4,5,6-pentafluoro phenyl)borate. Further, compared to the compounds whose anion is an antimony hexafluoride, those whose Y is oxygen has a higher sensitivity while being free from coloration, and those whose Y is sulfur has an equivalent sensitivity while being free from coloration. Those compounds whose Y is oxygen and has a higher sensitivity compared to those whose anion is phosphorus hexafluoride are free from coloration, while those whose Y is sulfur exhibits the same or more coloration.

Example 15

Production of Photo-Cationically Polymerizable Composition 4 and Evaluation 3

The photo-cationically polymerizable composition 7 was obtained in the same manner as in the Example 13 except that the Example Compound 7 was used in place of Example Compounds 4 to 6. The photo-cationically polymerizable composition 7 was evaluated in the same manner as in the Evaluation 1. The results are shown in Table 3.

Comparative Example 3

The photo-cationically polymerizable compositions for comparison 7 and 8 were obtained in the same manner as in the above Example 15 except that, in place of the Example Compound 7, a salt between a cation of the same kind and phosphorus hexafluoride (Comparative Example Compound 4) or another salt between a cation of the same kind and phosphorus hexafluoride (Comparative Example Compound 5) was used. The evaluation thereof was carried out in the same manner as in the Example 15. The results are shown in Table 3.

TABLE 3

| Cationically polymerizable composition | Cationic polymerization initiator | Anion component of cationic polymerization initiator | Sensitivity at 365 nm (mJ/cm$^2$) |
|---|---|---|---|
| 7 | Example Compound 7 | Anion Compound No. 1 | 23 |
| for comparison 7 | Comparative Example Compound 4 | antimony hexafluoride | 27 |
| for comparison 8 | Comparative Example Compound 5 | phosphorus hexafluoride | 208 |

According to Table 3 in the above, it was confirmed that the Example Compound 7 which is the salt compound according to the present invention has a higher sensitivity compared to those compounds whose anion is antimony hexafluoride or phosphorus hexafluoride

Example 16

Production of Photo-Cationically Polymerizable Compositions 8 to 10 and Evaluation 4

Sufficiently mixed were 100 parts of phenolic novolak epoxy resin, EPPN-201 (manufactured by Nippon Kayaku Co., Ltd.) and 100 parts of methyl ethyl ketone, and subsequently added thereto were 5 parts of each of the Example Compounds 8, 9 and 12 obtained in the above Examples 8, 9 and 12. The obtained mixtures were uniformly mixed to obtain the photo-cationically polymerizable resin compositions 8 to 10. These compositions were each coated on an aluminum plate to a thickness of about 10 μm using a bar coater (No. 6). Upon drying for 5 minutes at 80° C., the spectral sensitivity of the above photo-polymerizable compositions at 280 nm was measured using a monochromater.

This monochromater is equipped with a 300 W xenon lamp and diffraction grating and capable of separating monochromatic light having a wavelength of 280 nm. It is also capable of adjusting the irradiation energy using a shutter which allows irradiation of the monochromatic light for a set time. Provided immediately below the shutter's light existing slit is a movable stage onto which the aluminum plates coated with each of the above-described cationically polymerizable compositions can be placed. This movable stage moves in conjunction with the shutter, thereby enabling the adjustment of energy at 13 different levels. After baking the irradiated aluminum plates coated with each of the cationically polymerizable compositions for 10 minutes at 100° C., they were developed with methyl ethyl ketone, rinsed with xylene and dried. The spectral sensitivity was determined at a light having a wavelength of 280 nm based on the minimum curing energy required for curing which was estimated by the number of cured films remaining on the glass plate and the amount of outgoing light and shutter opening time. The results are shown in Table 4.

Comparative Example 4

The photo-cationically polymerizable compositions for comparison 9 to 11 were obtained in the same manner as in the above Example 16 except that, in place of the Example Compounds 8, 9 and 12 obtained in the above Examples 8, 9 and 12, salts between a cation of the same kind and antimony hexafluoride anion (Comparative Example Compounds 6 to 8) were used. The spectral sensitivity thereof was measured in the same manner as in the Example 16. The results are shown in Table 4.

TABLE 4

| Cationically polymerizable composition | Cationic polymerization initiator | Anion component of cationic polymerization initiator | Sensitivity at 280 nm (mJ/cm$^2$) |
|---|---|---|---|
| 8 | Example Compound 8 | Anion Compound No. 1 | 2.5 |
| 9 | Example Compound 9 | Anion Compound No. 1 | 2.5 |
| 10 | Example Compound 12 | Anion Compound No. 1 | 3.5 |
| for comparison 9 | Comparative Example Compound 6 | antimony hexafluoride | 3.5 |
| for comparison 10 | Comparative Example Compound 7 | antimony hexafluoride | 3.5 |
| for comparison 11 | Comparative Example Compound 8 | antimony hexafluoride | 4.5 |

According to Table 4 in the above, it was confirmed: that the Example Compound 8 which is the salt compound according to the present invention has a higher sensitivity compared to the Comparative Example Compound 6 whose cation species was the same as that of the Example Compound 8; that the Example Compound 9 has a higher sensitivity compared to the Comparative Example Compound 7 whose cation species was the same as that of the Example Compound 9; and that the Example Compound 12 has a higher sensitivity compared to the Comparative Example Compound 8 whose cation species was the same as that of the Example Compound 12.

Example 17

Production and Evaluation of Heat-Curable Cationically Polymerizable Compositions 11 and 12

Each of the Example Compounds 10 and 11 obtained in the above Examples 10 and 11 in an amount of 2.5 mmol was mixed into 100 g of alicyclic epoxy resin, Celloxide 2021P (manufactured by DAICEL CHEMICAL INDUSTRIES, LTD.), to obtain the heat-curable cationically polymerizable compositions 11 and 12. These compositions were poured into between two glass plates separated by a spacer having a thickness of 1 mm. After heating the thus obtained in an oven, the curability and the coloring of the cured product were evaluated. The results are shown in Table 5.

Comparative Example 5

The heat-curable cationically polymerizable compositions for comparison 12 and 13 were obtained in the same manner as in the above Example 17 except that, in place of the Example Compounds 10 and 11 obtained in the above Examples 10 and 11, salts between a cation of the same kind and antimony hexafluoride anion (Comparative Example Compounds 9 and 10) were used. The results are shown in Table 5.

According to Table 5 in the above, it was confirmed that the Example Compounds 10 and 11 which are the salt compounds according to the present invention exhibited a superior curability, while being free from coloration, compared to those compounds whose anion is antimony hexafluoride.

Example 18

Production and Evaluation of Optical Stereolithographic Resin Compositions 13 and 14 and Optical Stereolithographic Resin Compositions for Comparison 14 to 17

The optical stereolithographic resin compositions 13 and 14 and optical stereolithographic resin compositions for comparison 14 to 17 were obtained by sufficiently mixing the resins at the compounding ratio indicated in Table 6. The following Experiments 1 to 4 were carried out using the obtained resin compositions. The obtained results are shown in Table 6. It should be noted here that the numbers for the optical stereolithographic resin compositions in Table 6 are in parts by mass.

The materials used in the Experiments are as follows.

(1) As the cationically polymerizable organic substance (hereinafter, referred to as "cationic resin"), the following cationic resins 1 to 4 were used:

cationic resin 1: 3,4-epoxycyclohexylmethyl-3,4-epoxycyclohexane carboxylate cationic resin 2: 1,4-butanediol diglycidyl ether cationic resin 3: bis(3,4-epoxycyclo hexylmethyl) adipate cationic resin 4: bisphenol A diglycidyl ether (2) As the energy beam-sensitive cationic polymerization initiator (hereinafter, referred to as "cationic initiator"), the following cationic initiators 1 to 3 were used:

TABLE 5

| Cationically polymerizable composition | Cationic polymerization initiator | Curability | | | | Transmittance at 425 nm (%) | Transmittance at 450 nm (%) |
| --- | --- | --- | --- | --- | --- | --- | --- |
| | | 120° C. 15 minutes | 120° C. 60 minutes | 150° C. 15 minutes | 120° C. 60 minutes | | |
| 11 | Example Compound 10 | x | Δ | ○ → used in the evaluation of coloring | ○ | 47.5 | 85.8 |
| 12 | Example Compound 11 | ○ → used in the evaluation of coloring | ○ | ○ | ○ | 45.5 | 83.4 |
| for comparison 12 | Comparative Example Compound 9 | x | x | x | x | — | — |
| for comparison 13 | Comparative Example Compound 10 | x | x | x | x | — | — |

Curability:

○: completely cured,

Δ: cured but the obtained film was soft, x: remained in liquid form cationic initiator 1:

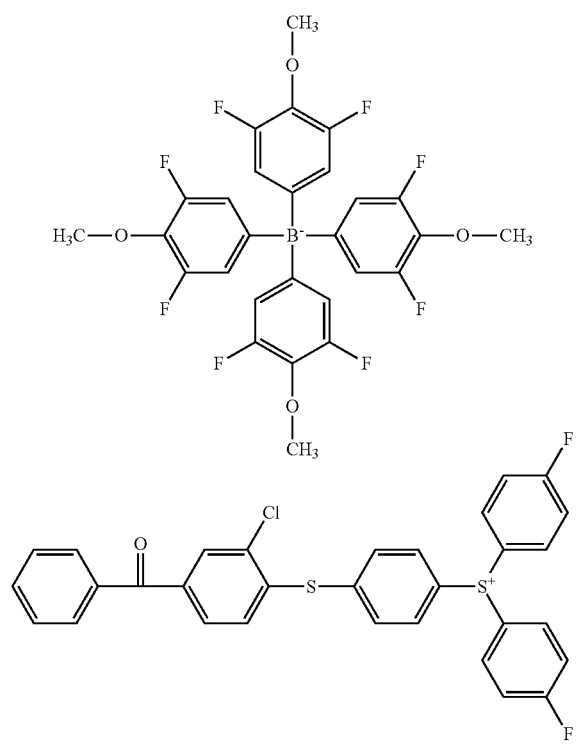

cationic initiator 2:

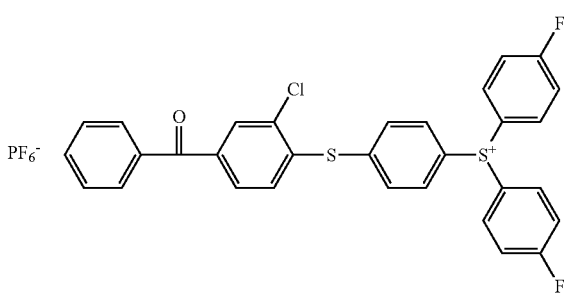

cationic initiator 3:

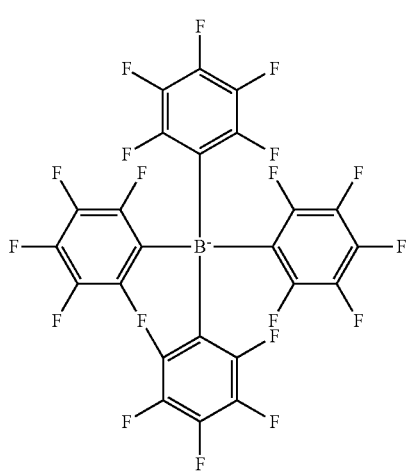

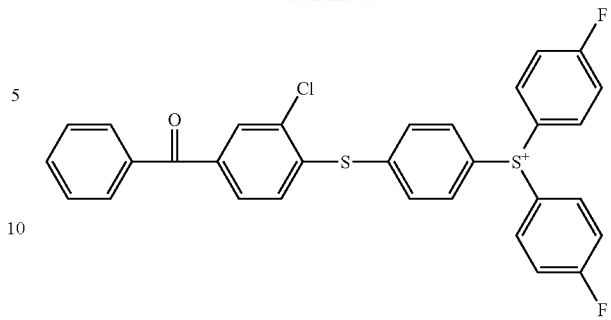

(3) As the radically polymerizable organic substance (hereinafter, referred to as "radical resin"), the following radical resins 1 and 2 were used:
radical resin 1: dipentaerythritol hexaacrylate
radical resin 2: acrylic compound of bisphenol A epoxy resin (4) As the energy beam-sensitive radical polymerization initiator (hereinafter, referred to as "radical initiator"), the following radical initiator 1 was used.
radical initiator 1: 2-hydroxy-2-methyl-1-phenylpropane-1-on (Experiment 1: Tests on molding accuracy (in the longitudinal and lateral directions) and molding properties)

A resin composition was loaded into an experimental system for optical stereolithography which consists of a movable NC table, optical system (including a laser) and control computer. Using this resin composition, a solid box having dimensions of a longitudinal length of 100 mm, a lateral length of 100 mm and a height of 10 mm was produced at a pitch of 0.1 mm based on the CAD data. The deviances from the CAD data in the longitudinal and lateral lengths were measured. In this process, the molding properties and the outer appearance of the obtained model were also observed.

(Experiment 2: Sensitivity Measurement)

Using the same experimental system employed in the Experiment 1, the sensitivity of a resin was measured according to the method described in a literature (Paul F. Jacobs (1993) Rapid Prototyping and Manufacturing: Fundamentals of StereoLithography, Nikkei Business Publications, Inc., p. 258)

(Experiment 3: Test on molding accuracy (the thickness of excessively cured portion in the depth direction)

Test pieces were produced in the same manner as in the Experiment 1, except that these test pieces do not have a support in the central portion. When the light is not absorbed enough during the curing of the central portion, the light reaches to the under layer where an excessively cured portion is formed. This excessively cured portion has an inferior curability and the hardness thereof is less compared to other portions. The thickness of the recess in the central portion formed after molding was measured by a vernier micrometer and the excessively cured portion was then removed by gentle scraping with a knife, followed by another measurement of the thickness of the recess. The thickness of the excessively cured portion was determined by the difference between the two measured thicknesses.

(Experiment 4: Measurement of Mechanical Strength)

Test pieces for bending test and impact test were obtained in the same manner as in the Experiment 1. Using the obtained test pieces, the bending strength, Izod impact strength (with notch) and tensile strength were measured in accordance with JIS-6911.

(Experiment 5: Measurement of Coloring of Cured Product)

Plates having dimensions of a longitudinal length of 20 mm, a lateral length of 20 mm and a thickness of 10 mm were produced in the same manner as in the Experiment 1. The surfaces thereof were polished to a smooth surface and the coloring of the cured product was measured in terms of Yellow Index (YI) by penetration. Further, the cured product was visually examined.

The laser used in these Experiments was Nd-YVO$_4$, that is, a laser whose wavelength was modified to ⅓ by combining a non-linear crystal with Nd-YVO$_4$ laser and which has a wavelength of 355 nm and oscillates in pulses (manufactured by Spectra-Physics K.K.; product name: BLIO-355Q).

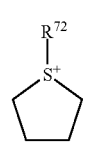

(10)

wherein $R^{72}$ represents a $C_1$-$C_{18}$ alkyl group which is optionally substituted by a hydroxyl group, a carboxyl group or a halogen atom, or a $C_1$-$C_{18}$ alkenyl group

TABLE 6

|  | Resin composition for optical stereolithography | | | | | |
|---|---|---|---|---|---|---|
|  | 13 | 14 | for comparison 14 | for comparison 15 | for comparison 16 | for comparison 17 |
| Cationic resin 1 | 75 | 35 | 75 | 35 | 75 | 35 |
| Cationic resin 2 | 25 | 15 | 25 | 15 | 25 | 15 |
| Cationic resin 3 | — | 10 | — | 10 | — | 10 |
| Cationic resin 4 | — | 10 | — | 10 | — | 10 |
| Cationic initiator 1 | 2 | 2 | — | — | — | 2 |
| Cationic initiator 2 | — | — | 2 | 2 | — | — |
| Cationic initiator 3 | — | — | — | — | 2 | 2 |
| Radical resin 1 | — | 20 | — | 20 | — | 20 |
| Radical resin 2 | — | 10 | — | 10 | — | 10 |
| Radical initiator 1 | — | 1 | — | 1 | — | 1 |
| Bending strength (kg/cm$^2$) | 650 | 740 | 400 | 480 | 600 | 650 |
| Izod (kg cm/cm$^2$) | 5.5 | 6.8 | 3.2 | 3.8 | 5.1 | 6.3 |
| Molding accuracy (in the longitudinal and lateral directions) (mm) | 0.012 | 0.009 | 0.018 | 0.019 | 0.015 | 0.012 |
| Sensitivity (mJ/cm$^2$) | 10.5 | 9.7 | 40 | 31 | 10.8 | 10.2 |
| Molding accuracy (excessively cured portion) (mm) | 0.14 | 0.03 | 0.31 | 0.05 | 0.18 | 0.04 |
| Coloring | 1.2 | 0.9 | 1.8 | 3 | 9.2 | 10.5 |
| Outer appearance | transparent and colorless | transparent and colorless | Pale yellow | Pale yellow | Pale yellow | Pale yellow |

The invention claimed is:

1. A salt compound is represented by the following general Formula (I):

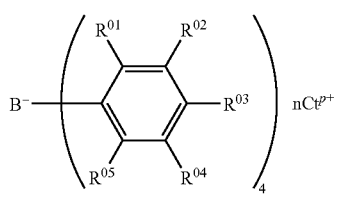

(1)

wherein $R^{01}$ to $R^{05}$ each independently represents a group selected from a hydrogen atom, a fluorine atom and —YR group, one of said $R^{01}$ to $R^{05}$ being a —YR group and at least two of said $R^{01}$ to $R^{05}$ being fluorine atoms;

Y represents an oxygen atom or a sulfur atom;

R represents a $C_1$-$C_4$ alkyl group;

$Ct^{p+}$ is a sulfonium cation represented by the following general Formula (10):

which is optionally substituted by a hydroxyl group, a carboxyl group or a halogen atom; and n represents a coefficient required for maintaining electrical neutrality.

2. The salt compound according to claim 1, wherein, in said general Formula (I), $R^{02}$ and $R^{04}$ are fluorine atoms and $R^{03}$ is a —YR group.

3. The salt compound according to claim 1, wherein $R^{01}$ and $R^{05}$ in said general Formula (1) are hydrogen atoms.

4. The salt compound according to claim 2, wherein $R^{01}$ and $R^{05}$ in said general Formula (1) are hydrogen atoms.

5. The salt compound according to claim 1, wherein Y in said general Formula (1) is an oxygen atom.

6. The salt compound according to claim 2, wherein Y in said general Formula (1) is an oxygen atom.

7. The salt compound according to claim 3, wherein Y in said general Formula (1) is an oxygen atom.

8. A cationic polymerization initiator comprises the salt compound according to claim 1.

9. A photo-cationically polymerizable composition contains the cationic polymerization initiator according to claim 8 and a cationically polymerizable organic compound.

10. A heat-curable cationically polymerizable composition contains the cationic polymerization initiator according to claim 8 and a cationically polymerizable organic compound.

* * * * *